United States Patent
Delvaux et al.

(10) Patent No.: US 6,971,057 B1
(45) Date of Patent: Nov. 29, 2005

(54) SYSTEM AND METHOD FOR EFFICIENT CONVOLUTIONAL INTERLEAVING/DE-INTERLEAVING

(75) Inventors: Marc Delvaux, Eatontown, NJ (US); Wenwei Pan, Highlands, NJ (US); Jian Wang, Morganville, NJ (US)

(73) Assignee: GlobespanVirata, Inc., Red Bank, NJ (US)

( * ) Notice: Subject to any disclaimer, the term of this patent is extended or adjusted under 35 U.S.C. 154(b) by 836 days.

(21) Appl. No.: 09/793,172

(22) Filed: Feb. 26, 2001

Related U.S. Application Data

(60) Provisional application No. 60/184,882, filed on Feb. 25, 2000.

(51) Int. Cl.[7] ............................................. H03M 13/03
(52) U.S. Cl. ........................ 714/788; 714/702; 714/762
(58) Field of Search ................................. 714/701–702, 714/762, 784, 788; 711/751, 786

(56) References Cited

U.S. PATENT DOCUMENTS

| | | | | |
|---|---|---|---|---|
| 5,737,337 A | * | 4/1998 | Voith et al. .................. | 714/702 |
| 5,745,497 A | * | 4/1998 | Ben-Efraim et al. ........ | 714/702 |
| 5,991,857 A | * | 11/1999 | Koetje et al. ............... | 711/157 |
| 6,151,690 A | * | 11/2000 | Peeters ........................ | 714/701 |
| 6,421,796 B1 | * | 7/2002 | Gatherer ...................... | 714/702 |

* cited by examiner

Primary Examiner—Guy J. Lamarre
(74) Attorney, Agent, or Firm—Thomas, Kayden, Horstemeyer & Risley

(57) ABSTRACT

A memory optimized system and method for data interleaving/de-interleaving are disclosed. A data interleaver/de-interleaver may be implemented with a memory device and an improved data interleaver/de-interleaver. The improved data interleaver/de-interleaver may be implemented with a controller, a first array, and a second array. The first array identifies a maximum depth value for each of a plurality of memory segments responsive to both a block data length and the desired interleaving/de-interleaving depth. The second array comprises an index associated with each of the plurality of memory segments that may be used to derive write and read addresses. In its broadest terms, the method can be described as: identifying a block data length, N, and an interleaver/de-interleaver depth, D; initializing a set of pointers associated with each of N memory segments; initializing a set of pointer maximum values responsive to the relative magnitude of N and D, identifying a memory index responsive to a base address and the set of pointer maximum values; using a memory segment identifier, a word identifier, and a byte identifier along with the memory index and the pointers to write/read the bytes of code words.

35 Claims, 20 Drawing Sheets

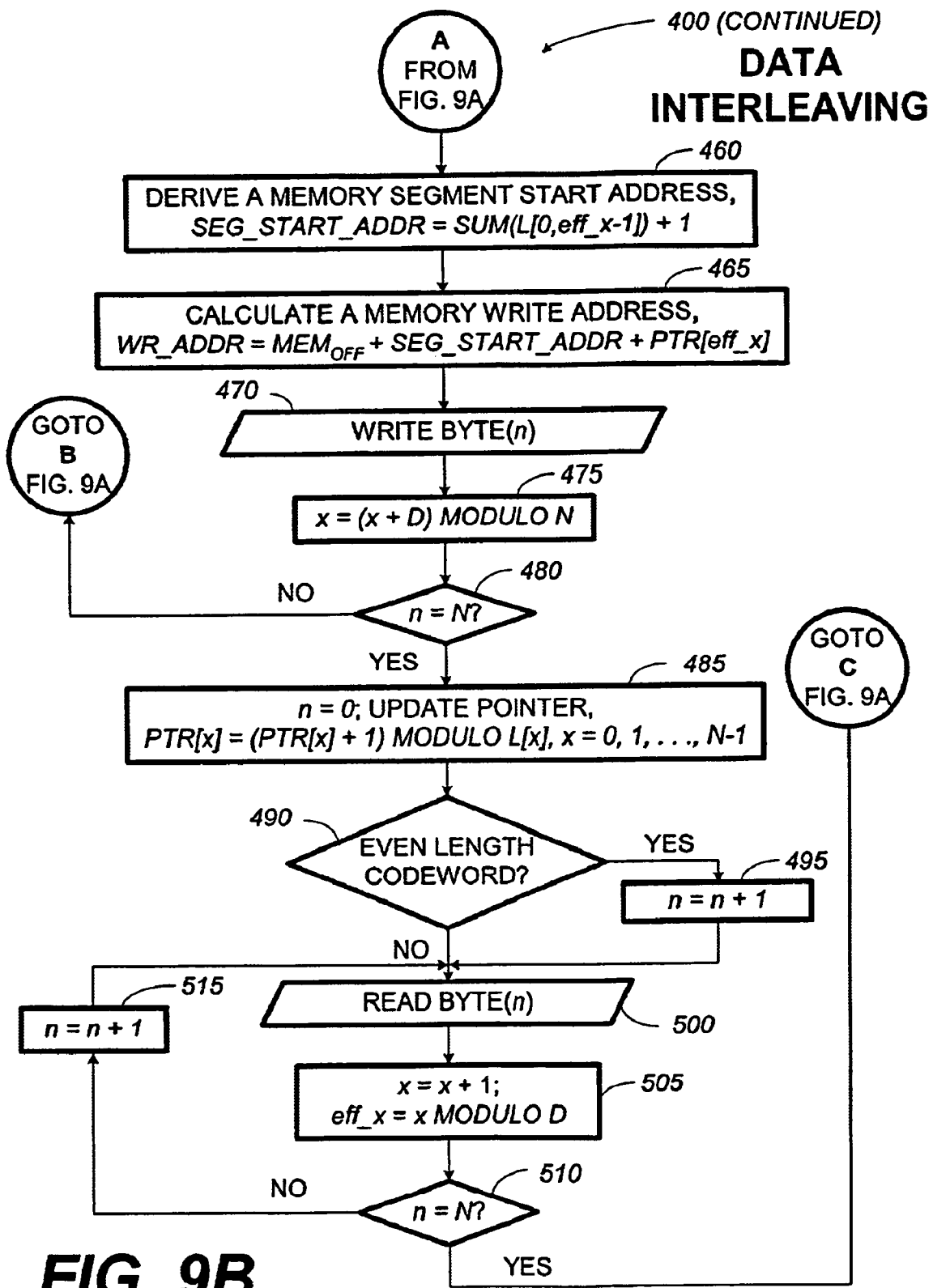

SYSTEM AND METHOD FOR EFFICIENT CONVOLUTIONAL INTERLEAVING/DE-INTERLEAVING

CROSS-REFERENCE TO RELATED APPLICATIONS

The present application claims the benefit of co-pending U.S. provisional patent application Ser. No. 60/184,882, filed Feb. 25, 2000, entitled, "Efficient Method For DMT Convolutional Interleaving/De-interleaving," which is hereby incorporated by reference in its entirety.

BACKGROUND OF THE INVENTION

1. Field of the Invention

The present invention generally relates to high speed data communications wherein signal information is processed both in digital and analog forms. More specifically, the invention relates to both a system and method that uses convolutional interleaving/de-interleaving to buffer the effects of burst errors in a data channel.

2. Discussion of the Related Art

In recent years, telephone communication systems have expanded from traditional plain old telephone system (POTS) communications to include high-speed data communications as well. As is known, POTS communications include the transmission of voice information, control signals, public switched telephone network (PSTN) information, as well as, information from ancillary equipment in analog form (i.e. computer modems and facsimile machines) that is transmitted in the POTS bandwidth.

Prompted largely by the desire of large businesses to reliably transfer information over a broadband network, telecommunications service providers have employed digital subscriber lines (DSL) to provide a plethora of interactive multi-media digital signals over the same existing POTS twisted-pair lines.

The provision of DSL services to customer premises has proliferated over recent years. DSL services are typically provided to remotely located customer premises by equipping both the appropriate central office and the customer premises with compatible DSL modems. DSL modems communicate by modulating a baseband signal with customer desired service signals, converting the modulated digital data signal to an analog signal, and transmitting the analog signal over the conventional copper wire pair provided in the PSTN from a central office to a customer premises via a carrier service area (CSA) loop. Well known data modulation and transmission techniques include mapping digital data to be transmitted into a multidimensional multi-level signal space constellation and decoding the received constellation to recover the transmitted information.

DSL modems use a number of different modulation schemes and rates. Asymmetric digital subscriber line (ADSL) systems adopted discrete multi-tone (DMT), a rate adaptive and tone flexible multi-carrier data transmission method. DMT systems, by nature of their distribution across multiple frequency bands, are capable of retuning modems to optimize data transfers for changing line conditions. DMT devices selectively transfer bits from the data stream in those discrete frequency bands that are uncorrupted from amplitude modulation radio interference and unaffected by phone system bridge taps, thereby tuning, or maximizing performance under changing line conditions.

To accommodate maximum flexibility for providers and end users of ADSL services, forward error correction (FEC) is selectively applied to the composite data streams to, or from, the central office ADSL modem. This permits FEC to be included or excluded on a data service by data service basis within the composite data stream.

As an example of the mixed requirements for FEC in an ADSL service, consider transmitting a one-way data stream from the central office to a remotely located computing device along with a bidirectional channel. The end user may require high reliability on the one-way channel because the channel may contain highly compressed digital data with no possibility for requesting retransmission. For this portion of the composite data stream, FEC is necessary. On the other hand, voice services and duplex data services with their own embedded protocols may require minimum latency. For this portion of the composite data stream, FEC is optional.

FEC involves the addition of redundant information to the data to be transferred. The data to be transferred along with the redundant data form what are commonly known as code words. FEC in ADSL employs Reed-Solomon codes based on symbols of 8 bits to a byte. That is, a code over the Galois Field ($2^8$). FEC in ADSL is rate adaptable providing for various interleave depths and block data lengths to support a range of data rates while maintaining constant interleave latency. An enhancement to FEC involves shuffling or interleaving the encoded data prior to transmission, then restoring the correct data sequence or de-interleaving the data received at the remote DSL modem. Interleaving ensures that noise bursts during data transmission do not adversely affect any individual code word in the transmission. If noise affects a particular frame of data, only a minimum number of bytes of any particular code word will be affected as the individual code words are distributed across multiple frames. The combination of Reed-Solomon encoding with data interleaving is highly effective at correcting errors caused by impulse noise in the service subscriber's local CSA loop. In convolutional interleaving, after writing a byte into interleave memory, a previously written byte is typically read from the same memory.

Standard T1.413, also known as, *Interface between Networks and Customer Installation-ADSL Metallic Interface*, provides for convolutional interleaving/de-interleaving along with Reed-Solomon coding for implementing a communication system with forward error correction (FEC). The standard provides an effective method for dealing with burst error channels in modem telecommunication systems. In DMT systems, two latency channels are supported: interleave data and fast data (without interleaving). Convolutional interleaving/de-interleaving is typically implemented by processing the Reed-Solomon encoded digital data sequence through a linear finite state shift register. In high bit rate applications like DMT, a random access memory (RAM) device may be used as the data storage means. Convolutional interleaving/de-interleaving is computation intensive. In software approaches that use a single address pointer and several modulo and addition operations to update the address pointer, system level concurrency and performance is adversely affected. Conversely, hardware approaches that utilize multiple pointers for interleaving/de-interleaving operations increase the complexity of the overall DSL system. The system performance trade-off introduced by FEC in the form of Reed-Solomon coding and convolutional interleaving can be described as increased data transmission reliability at the expense of increased channel latency. In light of the expected implementation and operational cost erosion for all data interface technologies, it is highly desirable to identify and implement communication systems that exhibit increased performance with minimal added cost and complexity.

Accordingly, there is a need for an improved system and method for interleaving/de-interleaving that optimizes system resources while retaining the high data integrity provided by performing FEC on critical data channels.

SUMMARY OF THE INVENTION

In light of the foregoing, the invention is a system and method that uses a memory device and a processor. The memory device provides at least the minimal necessary storage capacity for storing interleaved data along with an optimal set of indexed address pointers. The processor generates and manages the indexed memory address pointers in relation to a desired block data length, N, and an interleaving depth, D. The optimized system implementation results in a minimal overall system cost without sacrificing system performance.

To achieve the objects and advantages of the present invention, a system consistent with the present invention segments a block of memory within the memory device by performing a write operation of the first data word. This write operation serves to initialize the system by identifying a start memory address along with an optimum size for each memory segment. In a preferred embodiment, the starting address for each memory segment is stored in a register file. Each byte comprising a data block is referenced to one of N indexed memory segments. Furthermore, the memory segment index is defined in ascending order (0, 1, 2, . . . ) of a memory read operation. A set of pointers is initialized and managed in order to read/write data from the memory device. If N>D, only a set of D pointers is used. Otherwise, a set of N pointers is used. By performing read operations immediately after write operations, the same pointer for each respective memory segment may be used to perform both the write and read operations.

A method for data interleaving/de-interleaving is also disclosed. In its broadest terms, the method can be described as: identifying a block data length, N, and an interleaver/de-interleaver depth, D; initializing a set of pointers associated with each of N memory segments; initializing a set of pointer maximum values responsive to the relative magnitude of N and D, identifying a memory index responsive to a base address and the set of pointer maximum values; using a memory segment identifier, a word identifier, and a byte identifier along with the memory index and the pointers to write/read the bytes of N code words. It will be appreciated by those skilled in the art that de-interleaving of the interleaved data may be performed by inverting the procedure. More specifically, the initialization for the de-interleaving memory (i.e., a memory device in communication with a DMT receiver) is performed by writing selective bytes in the first D data blocks. The de-interleaving memory segment index is defined in numeric ascending order in the direction of a memory write operation.

Other objects, features, and advantages of the present invention will become apparent to one skilled in the art upon examination of the following drawings and detailed description. It is intended that all such additional objects, features, and advantages be included herein within the scope of the present invention, as defined by the claims.

BRIEF DESCRIPTION OF THE DRAWINGS

The accompanying drawings illustrate several aspects of the present invention and together with the description serve to explain the principles of the invention. In the drawings:

FIGS. 9A–9B present a flowchart illustrating a method for data interleaving consistent with the present invention;

DETAILED DESCRIPTION OF THE PREFERRED EMBODIMENTS

Figure 1:
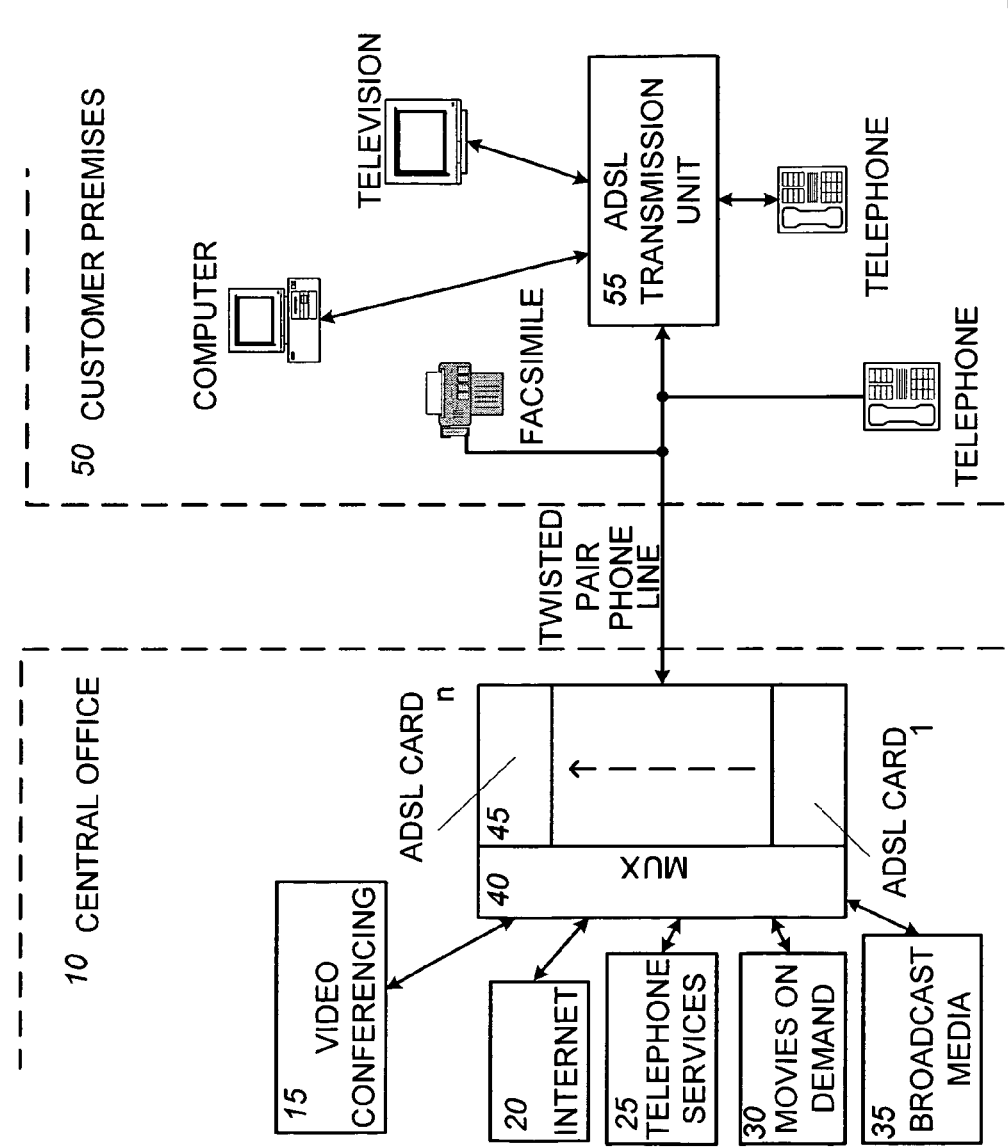
FIG. 1 is a block diagram illustrating the delivery of multiple broadband services via an ADSL communications system.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims. Turning now to the drawings, wherein like referenced numerals designate corresponding parts throughout the drawings, reference is made to FIG. 1, which illustrates the delivery of broadband communication services via an ADSL communications system over the POTS network. In this regard, a central office 10 is configured to receive broadband services which it assembles via a central office ADSL card 45 for transmission over a POTS twisted-pair phone line to a customer premises 50. Examples of such broadband services are depicted as video conferencing 15, Internet 20, telephone services 25, movies on demand 30, and broadcast media 35. The central office 10 assembles signals from the aforementioned broadband services via a multiplexer (mux) 40 for appropriate transformation and transmission by a plurality of ADSL cards 45 designated to provide subscriber services to an associated customer premises 50.

The customer premises 50 has a compatible ADSL transmission unit 55, which processes and distributes the several services to appropriate destination devices such as a computer, a television, a facsimile machine, and a telephone as illustrated. It is significant to note that the customer premises 50 may have POTS devices such as a facsimile machine and another telephone integrated on the POTS twisted pair telephone line along with the ADSL transmission unit 55. It should be understood that the circuitry conventionally implemented in, for example, an ADSL transceiver will be included within the ADSL cards 45 and the ADSL transmission unit 55 as shown in FIG. 1. The implementation of such circuitry will be appreciated by persons skilled in the art and need not be described herein to understand the teachings and principles of the present invention.

Figure 2:
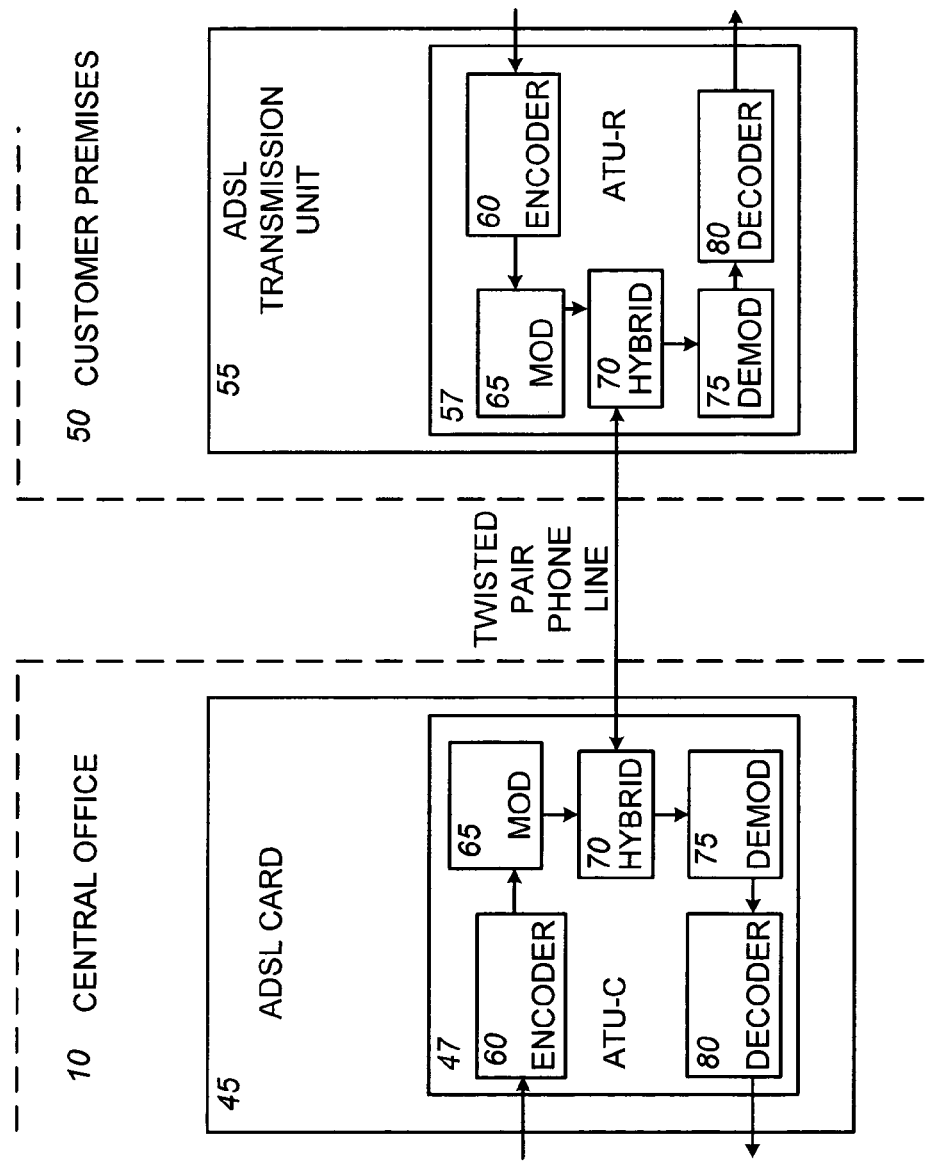
FIG. 2 is a block diagram further illustrating the functions performed within compatibly configured ADSL transmission units at a central office and a remote location consistent with the communications system of FIG. 1.

Having provided a top level description of a communications system configured to deliver a multitude of broadband services, reference is now directed to FIG. 2, which illustrates a portion of the ADSL modem card 45 and an ADSL transmission unit 55 as shown in FIG. 1. In this regard, the ADSL modem card 45 contains an ADSL modem unit—central office, hereinafter ATU-C 47. Similarly, the ADSL transmission unit 55 contains an ADSL transmission unit-remote, hereinafter ATU-R 57. Both the ATU-C 47 and the ATU-R 57 serve to enable two-way communications between an ADSL modem card 45 and its associated ADSL transmission unit 55 via the PSTN. Since each ATU is similarly configured, the description herein will address the five functional blocks only once. Both the ATU-C 47 and the ATU-R 57 receive digital data in an encoder 60. The encoder 60 processes the digital data and forwards it to a modulator 65, which adaptively applies the digital data across the DMT frequencies. The modulator 65 then forwards a multitude of designated spread spectrum frequencies to a hybrid 70 for data transmission along the PSTN line. In the manner described above, data is assembled, adaptively applied, and transmitted from one ADSL device to another across each of the separate DMT channels as the physical characteristics of the environment surrounding each individual system allows.

Similarly, the hybrid 70 is configured to receive a multitude of spread spectrum frequencies from the remote ADSL transmission unit 55 along the PSTN line. The hybrid 70 forwards designated spread spectrum frequencies to a demodulator 75. The demodulator 75 processes the set of spread spectrum frequencies to recover digital data. The demodulator 75 forwards the digital data to a decoder 80. The decoder 80 processes the digital data and distributes it to the appropriate broadband device.

Figure 3:
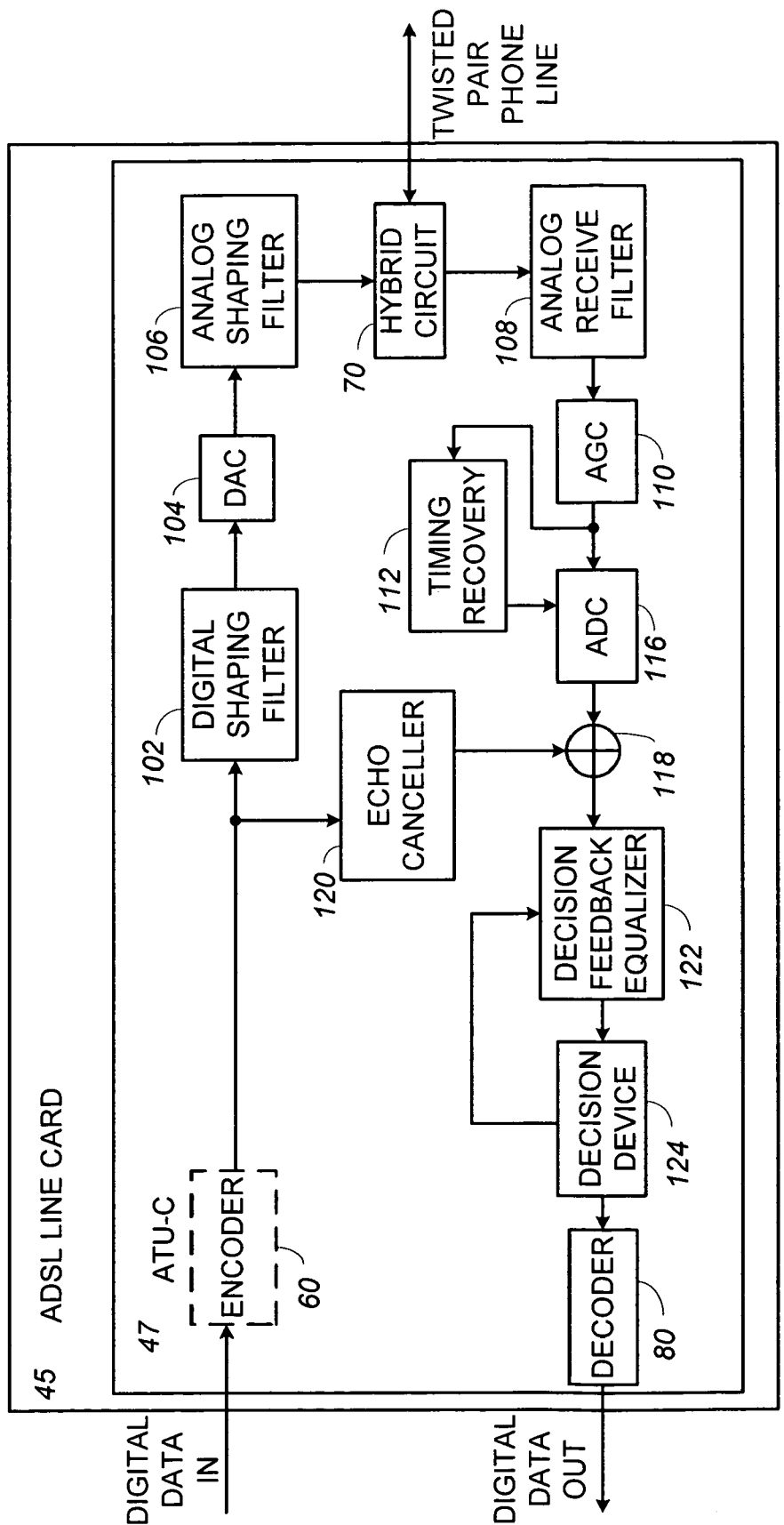
FIG. 3 is a block diagram that illustrates the functional elements of an ADSL transmission unit introduced in FIGS. 1 and 2.

Having provided a top level description of the functional blocks of an ADSL communications system configured to deliver a multitude of broadband services, with regard to FIG. 2, reference is now directed to FIG. 3, which further illustrates the ATU-C 47 introduced in FIG. 2. As shown in FIG. 3, an ATU-C 47 may be disposed within an ADSL line card 45 of FIG. 2 at either station in a two-station communication system (i.e., at the central office 10 or at the customer premises 50). As shown in FIG. 3, an ATU-C 47 may comprise an encoder 60, a digital shaping filter 102, a digital to analog converter (DAC) 104, an analog shaping filter 106, and a hybrid circuit 70 in a transmit (downstream) data path. Conversely, the ATU-C 47 may comprise the hybrid circuit 70, an analog-receive filter 108, an automatic gain control amplifier (AGC) 110, a timing-recovery circuit 112, an analog to digital converter (ADC) 116, a summer 118, an echo canceler 120, a decision-feedback equalizer 122, a decision device 124, and a decoder 80 in a receive (upstream) data path.

In this regard, the downstream data transmission portion of an ATU-C 47 may function as follows. The bits of the digital data input signal may be encoded into a complex data symbol in the encoder 60. The complex data symbols may be forwarded to the digital shaping filter 102 and the echo canceler 120. The digital shaping filter 102 may take the form of a finite impulse response (FIR) filter selected and used to shape the frequency spectrum across a particular ADSL communication channel. The output of the digital-shaping filter 102 may then be forwarded to DAC 104. Having converted the digitally filtered complex data symbols representing the digital input data stream in DAC 104 to an analog signal, the analog representation of the digital data input stream may be further processed by the analog-shaping filter 106. In this regard, the analog-shaping filter 106 may take the form of a Butterworth low-pass filter to control out-of-band energy present in the analog signal. The filtered transmit signal may then be coupled to the twisted pair telephone line via the hybrid circuit 70. The hybrid circuit 70 may comprise two unidirectional ports (one for data transmission and one for data reception) and one bidirectional port. The bi-directional port may be integrated with the twisted-pair telephone line. If the impedance of the twisted-pair matches the design impedance of the hybrid circuit 70, there will be perfect isolation between the transmitting and receiving ports. For this ideal case, the hybrid-circuit return loss is infinity. In reality, the line impedance is a variable of frequency and varies significantly between individual twisted pair telephone lines.

Having briefly described the downstream functional operation of the ATU-C 47, reference will now be directed to the upstream data transmission within the ATU-C 47. In this regard, a Butterworth low-pass filter may also be used for the analog receive filter 108. The analog-receive filter 108, like its counterpart in the transmission path of the ATU-C 47 is inserted to reduce out-of-band noise. Having removed the low frequency out-of-band noise in the analog receive filter 108, the filtered analog data stream may be forwarded to the AGC 110. The AGC 110 may be necessary to bring the received signal magnitude to that close to the normal transmit signal level for subsequent digital conversion and processing. Having adjusted the magnitude of the received signal in the AGC 110, the filtered and amplified receive signal may be processed through the timing recovery circuit 112. The timing recovery circuit 112 typically coordinates the sampling clocks used to process data in both the DAC 104 in the downstream data path, as well as, the ADC 116 in the receive data path. The ADC 116 may be synchronized to the DAC 104 through the timing-recovery circuit 112 such that upstream and downstream data symbols are synchronized within the ATU-C 47.

Once the received data has been converted to a digital data stream in the ADC 116, digital signal processing of the complex data symbols encoded within the received signal path may be processed. After analog to digital conversion, the output of the echo canceler 120 from the downstream data path may be mathematically combined with the received signal. The combination may take place in summer 118.

The echo canceler 120 may be designed to resemble the equivalence of the echo path as defined by both the digital and analog shaping filters 102, 106, the DAC 104, the hybrid circuit 70, the analog-receive filter 108, the AGC 110, the timing-recovery circuit 112, and the ADC 116. In typical configurations, the echo path transfer function is identified with an adaptive signal-processing algorithm.

The decision-feedback equalizer 122 may further filter the digitized and echo-canceled received signal before forwarding the received signal to a decision device 124. The decision-feedback equalizer 122 may comprise a feed-forward filter and a feedback filter (not shown). The feed-forward filter equalizes the precursor of the twisted-pair telephone line impulse response, while the feedback filter cancels the effect of the post-cursor of the channel impulse response. The decision-feedback equalizer 122 is necessary for the ATU-C 47 to maintain minimal noise enhancement during the channel equalization process. The decision device 124 may take the form of a threshold detector (not shown) configured to correspond to the discrete voltage levels used by the line code. After signal processing in the decision device 124, received symbols are converted back into signal bits in the decoder 80 to create a digital data bit stream.

Forward Error Correction

Figure 4:
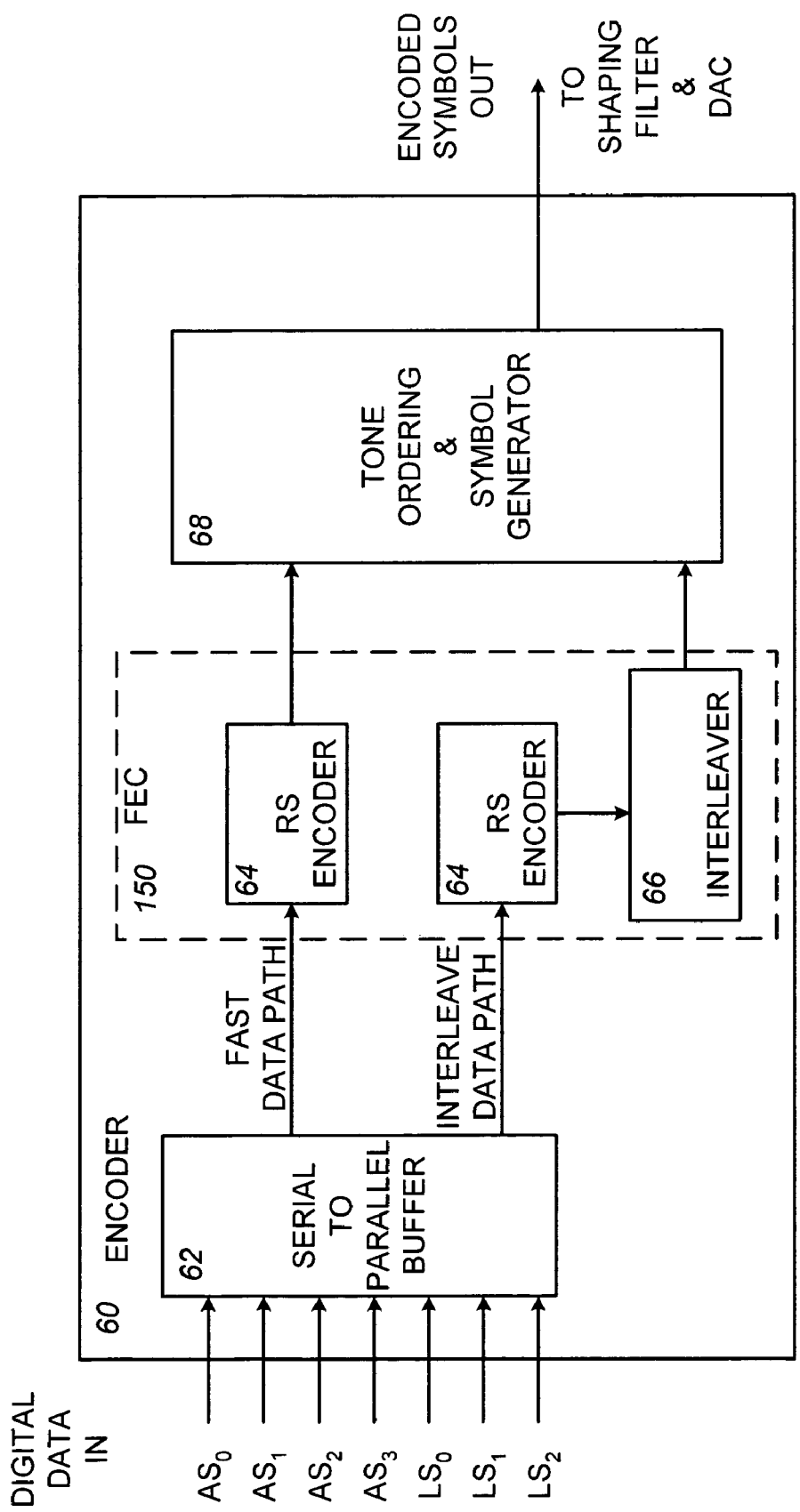
FIG. 4 is a functional block diagram illustrating a data encoder with FEC.

Having described both the upstream and downs processing paths trough an ATU-C 47 with regard to FIG. 3, reference is now directed to FIG. 4. In this regard, FIG. 4 is a functional block diagram illustrating forward error correction (FEC) in the encoder 60 of FIGS. 2 and 3.

As illustrated in FIG. 4, an encoder 60 configured to perform FEC may comprise a serial to parallel buffer 62, a FEC 150, and a tone ordering and symbol generator 68. As further illustrated in FIG. 4, the FEC 150 may comprise one or more Reed-Solomon encoders 64 and an interleaver 66.

Digital data signals enter the encoder 60 on one or more possible input paths herein illustrated as $AS_0$, $AS_1$, $AS_2$, $AS_3$, $LS_0$, $LS_1$, and $LS_2$. "AS" stands for asymmetric signal and corresponds to downstream simplex data designated for transmission from the ATU-C 47 to the ATU-R 57. The data rates on each of the $AS_x$ channels are determined through rate negotiation. The LS channels are similar, except that they are bidirectional and typically operate at a lower transmission rate. Different $AS_x$ and $LS_x$ channels may correspond to different digital services. For example, $LS_x$ channels may be used for videophone, digital telephony, data transfer, and signaling. $AS_x$ channels are typically used for high-quality digital video, but are also appropriate for high-speed data transfers.

One of ADSL's features, rate negotiation, accommodates various applications within a single standard compliant modem. During initialization of the ADSL link, the ATU-C 47 transmits a set of data rates that it would prefer to use. The ATU-R 57 can implement these rates, or signal the ATU-C 47 that it is unable to support the preferred rates. The number of bytes per symbol and selected coding options are exchanged during rate negotiation for each of the $AS_x$ and $LS_x$ channels.

Another feature supported by using separate data paths through the ATU-C 47 is the fast/interleave data processing concept. As illustrated in FIG. 4, the $AS_x$ and $LS_x$ data channels may be processed by the serial to parallel buffer 62 to create fast path data and interleave data for FEC processing in Reed-Solomon encoders 64 located within the FEC 150. Data signals requiring low-latency transfer through the ADSL communication link may be assigned (through the rate negotiation function) to a fast data path with minimal latency. Data signals that can tolerate a longer processing delay may be assigned to an interleave path that has much better immunity to noise impulses. Data bits in the interleave path are time interleaved over a relatively long period of time to disperse the effect of data transmission errors introduced by temporary impulsive disturbances on the twisted-pair telephone line.

As further illustrated in FIG. 4, both the fast and interleaved data paths are independently applied to Reed-Solomon encoders 64 as shown in FEC 150. Reed-Solomon encoders 64 independently generate N symbol code words comprising K data symbols of S bits each with N-K parity symbols of S bits each added thereto. The total number of parity symbols is equal to 2T, where 2T=N−K. The N symbol code words are a systematic code because the encoded data is left unchanged and the parity symbols are appended. Reed-Solomon codes provide a significant advantage in that they can correct up to T symbol errors in the N symbol code word. Given a symbol size S (the bit width per symbol), the maximum code word length N for a Reed-Solomon code is $N=2^S-1$. Generally, the amount of processing power required to encode and decode Reed-Solomon codes is related to the number of parity symbols per N symbol code word. A large value for T translates into the ability to correct a large number of errors in the received N symbol code word, but correspondingly requires more computational power than if T were of a smaller magnitude.

A Reed-Solomon N symbol code word is generated using a generator polynomial, where all valid code words are exactly divisible by the generator polynomial. The form of the generator polynomial is given by $g(x)=(x-\alpha^i)(x-\alpha^{i+1}) \ldots (x-\alpha^{i+2i-1})$, the N symbol code word is generated using $c(x)=g(x)i(x)$, where $g(x)$ is the generator polynomial, $i(x)$ is the information or data block, $c(x)$ is a valid N symbol code word, and $\alpha$ is a primitive element of the field. The 2T parity symbols in the N symbol code word are given by $p(x)=i(x)x^{N-K} \mod g(x)$.

As further illustrated in FIG. 4, the Reed-Solomon encoded fast path data and the Reed-Solomon encoded interleaved data may be forwarded for further digital processing by the tone ordering and symbol generator 68 prior to being processed by the shaping filters 102, 106, and the DAC 104 prior to transmission via the hybrid 70 (see FIG. 3).

A Typical N×D Memory Array Approach to Data Interleaving/De-Interleaving in Forward Error Correction Having described an exemplary prior art encoder 60 with regard to FIG. 4, reference is now directed to FIG. 5, which illustrates the operation of data interleaving for the case where the interleaver depth, D, is 4 bytes and the code word length N, is 7 bytes.

Figure 5A:
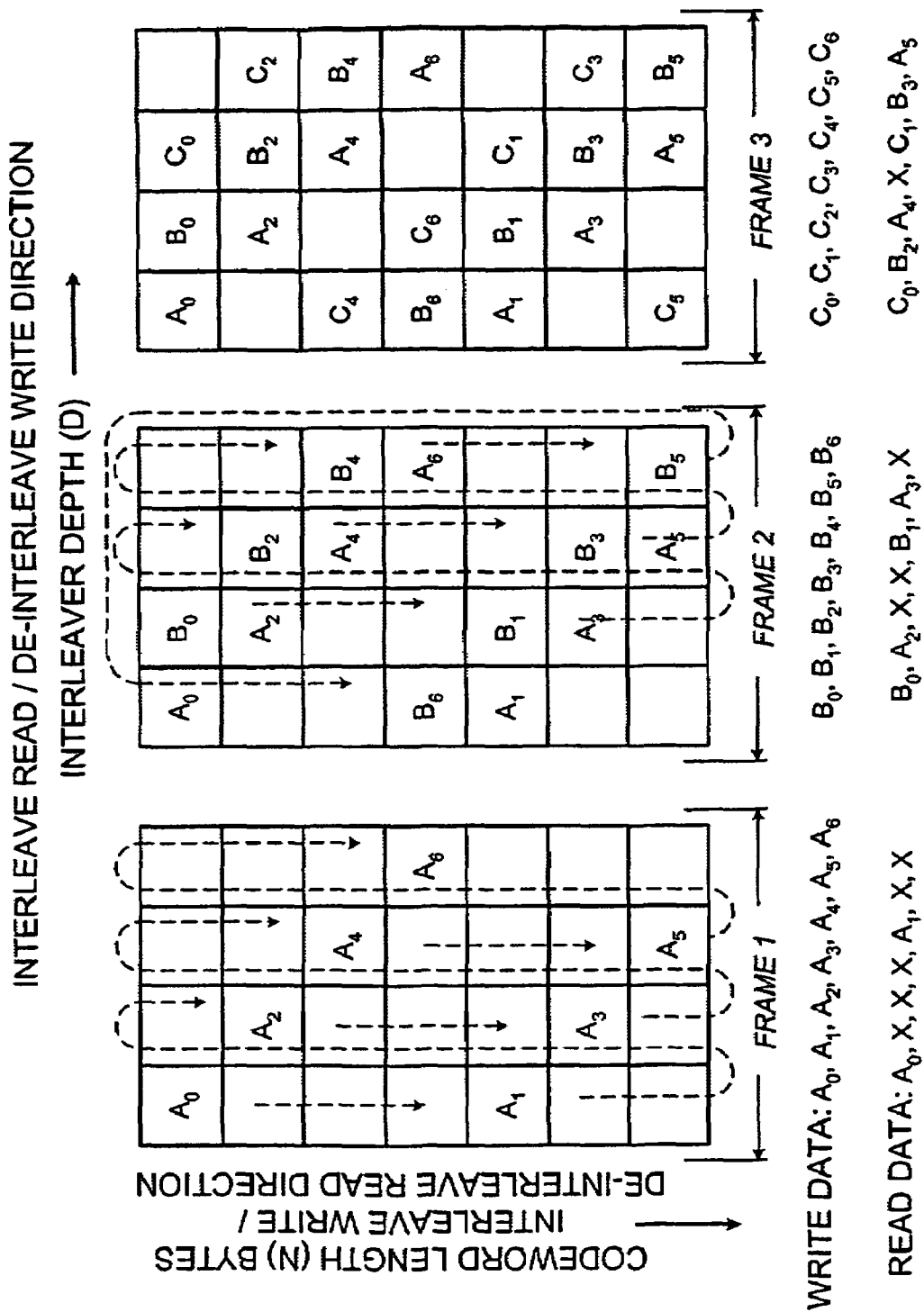
FIGS. 5A–5C form a set of schematic diagrams illustrating a common approach to data interleaving with a N×D data array.
Figure 5B:
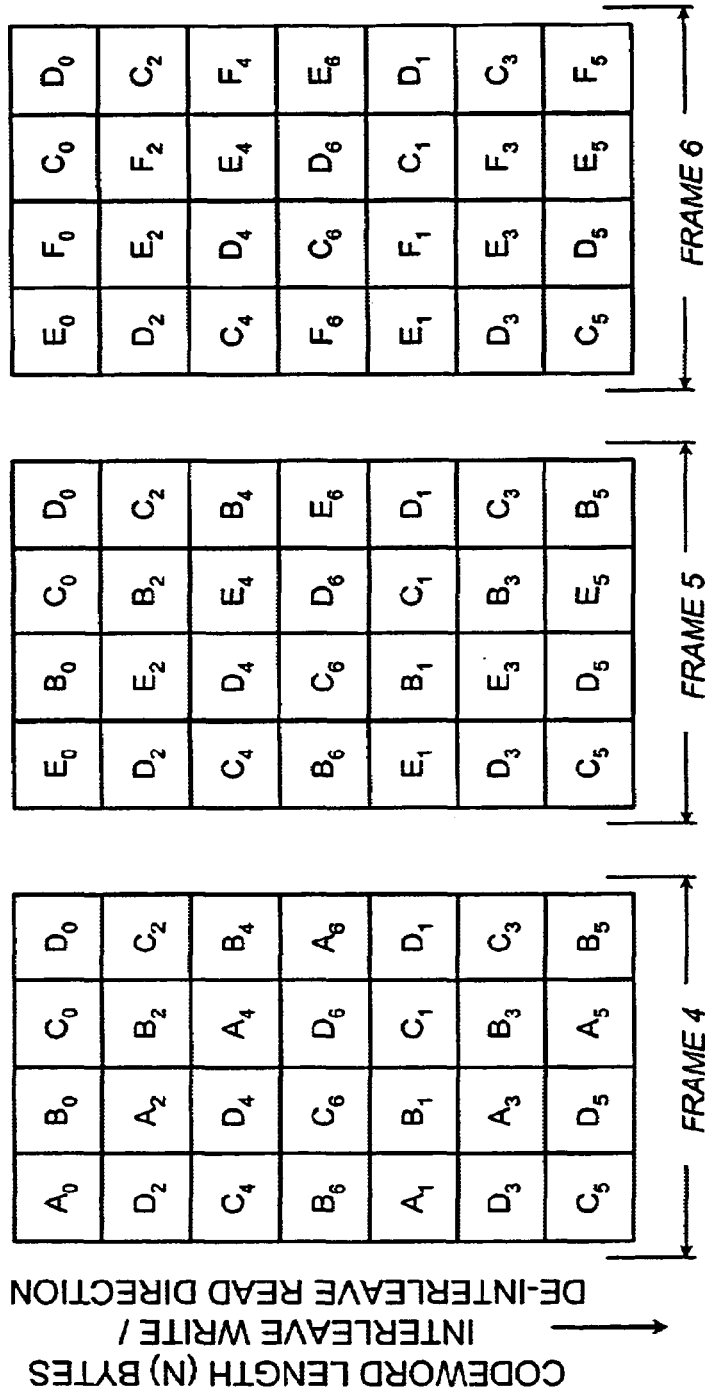

In this regard, FIG. 5A illustrates the placement of write data bytes in the 4 by 7 array defined by the interleaver depth and the code word length of the present example. As illustrated in frame 1, a first 7-byte code word herein represented by bytes $A_0$ through $A_6$ may be interleaved (stored) into the 4 by 7 memory array as follows. The first byte, $A_0$ may be placed in a reference position defined by a base address in the upper left-hand corner of the memory array. Thereafter, subsequent data bytes may be stored as shown in frame 1 every fourth location (the interleaver depth) from the previous byte in the interleaver write direction (i.e., from top to bottom in the memory array). Once the first column locations have been traversed, the interleave pointer may be configured to shift one column to the right (i.e., in the interleaver read direction) as further illustrated in frame 1. It is significant to note that each of the frames 1 through 7 illustrated in FIGS. 5A and 5B are illustrated in a snapshot condition at the completion of the frame. As further illustrated in FIG. 5A, at the completion of frame 1, data bytes $A_0, A_1, A_2, A_3, A_4, A_5$, and $A_6$ are located in the memory array as shown. If the memory array is read at the completion of frame 1, the data read comprises bytes $A_0$, X, X, X, $A_1$, X, and X as illustrated in frame 1.

Reference is now directed to frame 2 of FIG. 5A, which illustrates the processing of a second symbol into the memory array. As illustrated in frame 2, the second symbol herein represented by bytes $B_0$ through $B_6$ may be interleaved (stored) into the 4 by 7 memory array as follows. The first byte, $B_0$ may be placed in the memory position adjacent and to the right of the reference position as defined by the base address. Thereafter, subsequent data bytes may be stored as shown in frame 2 every fourth location from the previous byte. Once the second column locations have been traversed, the interleave pointer may be configured to shift one column to the right as further illustrated in frame 2. Once columns 2 through 4 have been exhausted, the interleaver may be configured to return to the first column as illustrated in frame 2 of FIG. 5A. As further illustrated in FIG. 5A, at the completion of frame 2, data bytes $B_0, B_1, B_2, B_3, B_4, B_5,$ and $B_6$ are located in the memory array as shown. If the memory array is read at the completion of frame 2, the data read comprises bytes $B_0, A_2,$ X, X, $B_1, A_3,$ and X. It is significant to note that the location of the 7-bytes of the first code word is not affected as of the completion of frame 2.

Having described the interleaving of the first two symbols after a second frame is processed, reference is now directed to frame 3 of FIG. 5A, which illustrates the processing of a third symbol into the memory array. As illustrated in frame 3, the third symbol herein represented by bytes $C_0$ through $C_6$ may be interleaved (stored) into the 4 by 7 memory array as follows. The first byte, $C_0$ may be placed in the memory position two columns to the right of the reference position as defined by the base address. Thereafter, subsequent data bytes may be stored as shown in frame 3 every fourth location from the previous byte. Once the third column locations have been traversed, the interleave pointer may be configured to shift one column to the right as previously illustrated with regards to frames 1 and 2. Again, once columns 3 and 4 have been exhausted the interleaver may be configured to return to the first column as previously shown. As further illustrated in FIG. 5A, at the completion of frame 3, data bytes $C_0, C_1, C_2, C_3, C_4, C_5,$ and $C_6$ are located in the memory array as shown. If the memory array is read at the completion of frame 3, the data read comprises bytes $C_0, B_2, A_4,$ X, $C_1, B_3,$ and $A_5$. It is significant to note that the location of the 7-bytes of the first two code words is not affected as of the completion of frame 3.

Reference is now directed to frame 4, which is shown as the left most frame of the composite of FIG. 5B. As illustrated in FIG. 5B, the left-most frame illustrates the processing of a fourth symbol into the memory array. As illustrated in frame 4 of FIG. 5B, the fourth symbol herein represented by bytes $D_0$ through $D_6$ may be interleaved (stored) into the 4 by 7 memory array as follows. The first byte, $D_0$ may be placed in the memory position three columns to the right of the reference position as defined by the base address. Thereafter, subsequent data bytes may be stored as shown in frame 4 every fourth location from the previous byte. Once the fourth column locations have been expended, the interleave pointer may be configured to shift back to the first column as previously illustrated with regards to frame 2. As further illustrated in FIG. 5B, at the completion of frame 4, data bytes $D_0, D_1, D_2, D_3, D_4, D_5,$ and $D_6$ are located in the memory array as shown. If the memory array is read at the completion of frame 4, the data read comprises bytes $D_0, C_2, B_4, A_6, D_1, C_3,$ and $B_5$. It is significant to note that the location of the 7-bytes of the first three code words are not affected and that the memory array is full as of the completion of frame 4.

Having described the interleaving of the first four symbols after a fourth frame is processed, reference is now directed to frame S of FIG. 5B, which illustrates the processing of a fifth symbol into the memory array. As illustrated in frame 5 of FIG. 5B, the fifth symbol herein represented by bytes $E_0$ through $E_6$ may be interleaved (stored) into the 4 by 7 memory array as follows. The first byte, $E_0$ may be placed in the reference position as defined by the base address. Thereafter, subsequent data bytes may be stored as shown in frame 5 every fourth location from the previous byte. As illustrated in FIG. 5B, at the completion of frame 5, data bytes $E_0, E_1, E_2, E_3, E_4, E_5,$ and $E_6$ are located in the memory array in those positions where the first code word was located. If the memory array is read at the completion of frame 5, the data read comprises bytes $E_0, D_2, C_4, B_6, E_1, D_3,$ and $C_5$. It is significant to note that after the completion of frame 5, the first code word is no longer present in the memory array. The second and third code words (previously stored) are not affected as of the completion of frame 5.

Having described the interleaving of the first five symbols after a fifth frame is processed, reference is now directed to frame 6 of FIG. 5B, which illustrates the processing of a sixth symbol into the memory array. As illustrated in frame 6 of FIG. 5B, the sixth symbol herein represented by bytes $F_0$ through $F_6$ may be interleaved (stored) into the 4 by 7 memory array as follows. The first byte, $F_0$ may be placed in the memory location adjacent and to the right of the reference position as defined by the base address. Thereafter, subsequent data bytes may be stored as shown in frame 6 every fourth location from the previous byte. As illustrated in FIG. 5B, at the completion of frame 6, data bytes $F_0, F_1, F_2, F_3, F_4, F_5,$ and $F_6$ are located in the memory array in those positions where the second code word was located. If the memory array is read at the completion of frame 6, the data read comprises bytes $F_0, E_2, D_4, C_6, F_1, E_3,$ and $D_5$. It is significant to note that after the completion of frame 6, the first and second code words are no longer present in the memory array. The third and fourth code words (previously stored) are not affected as of the completion of frame 6.

Figure 5C:
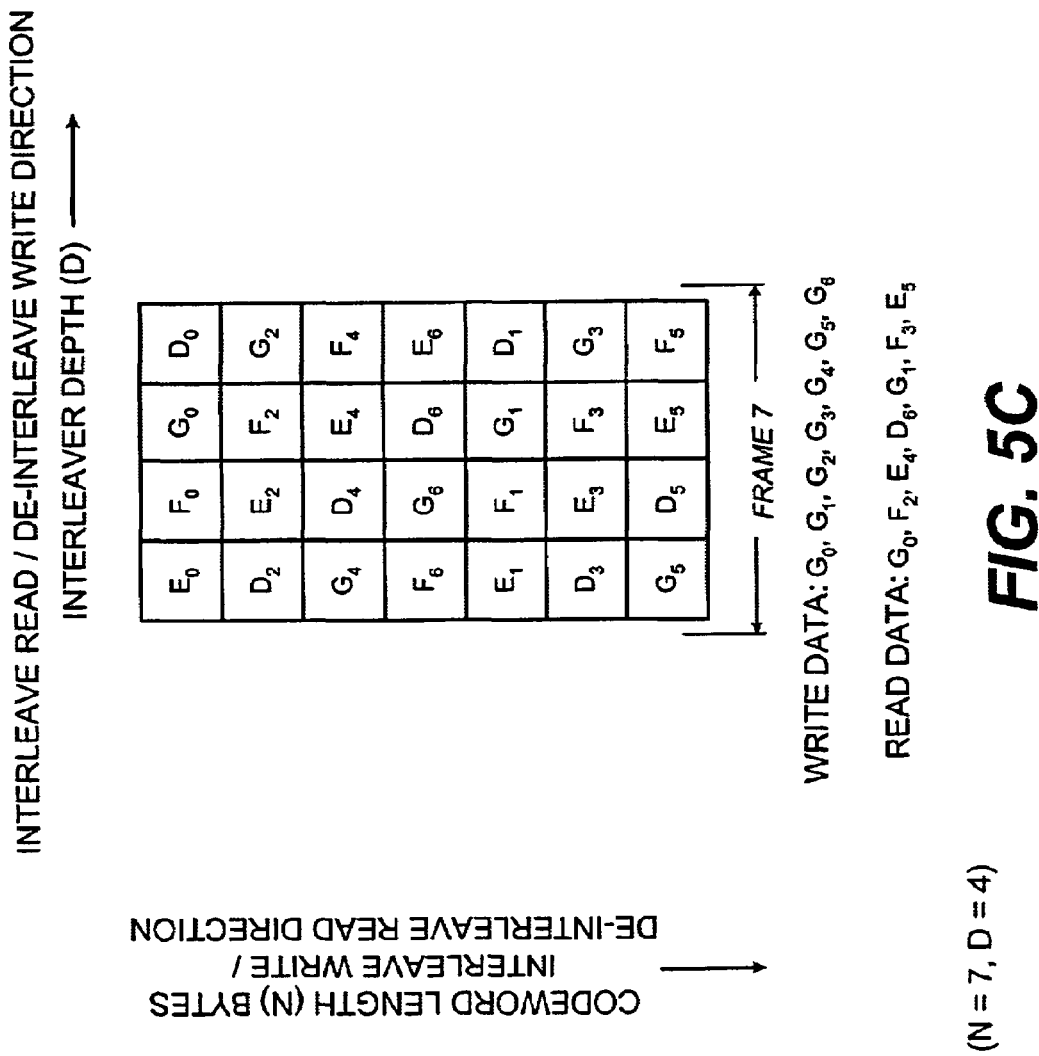

Reference is now directed to frame 7, which is illustrated in FIG. 5C. As illustrated in frame 7 of FIG. 5C, a seventh symbol herein represented by bytes $G_0$ through $G_6$ may be interleaved (stored) into the 4 by 7 memory array as follows. The first byte, $G_0$ may be placed in the memory position two columns to the right of the reference position as defined by the base address. Thereafter, subsequent data bytes may be stored as shown in frame 4 every fourth location from the previous byte. Once the third column locations have been exhausted, the interleave pointer may be configured to shift to the fourth column. Once the fourth column locations have been traversed, the interleave pointer may be configured to return to the left most column as previously described. After completion of frame 7, data bytes $G_0, G_1, G_2, G_3, G_4, G_5,$ and $G_6$ are located in the memory array as shown. If the memory array is read at the completion of frame 7, the data read comprises bytes $G_0, F_2, E_4, D_6, G_1, F_3,$ and $E_5$.

Figure 6:
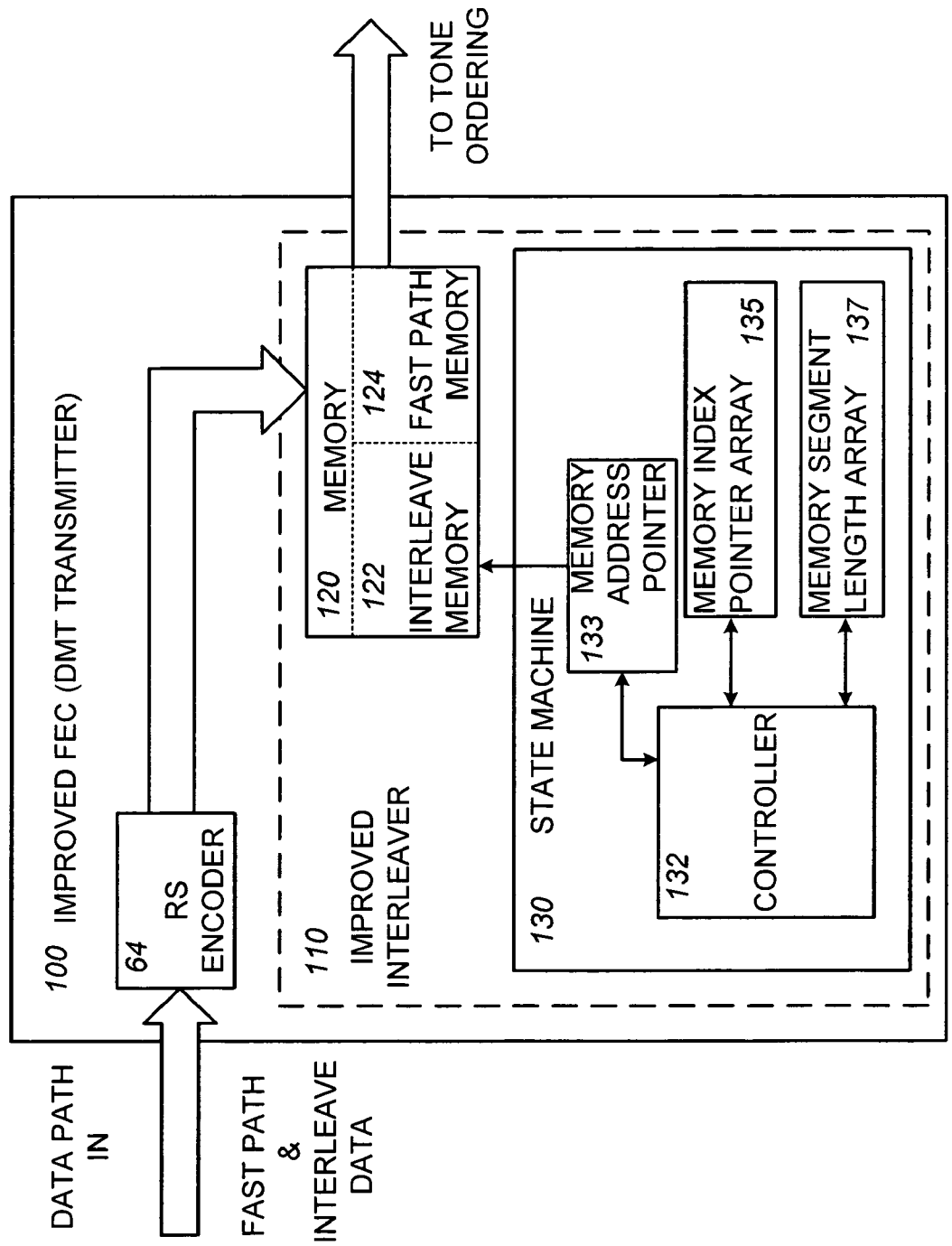
FIG. 6 is a functional block diagram illustrating an optimized state machine within an interleaver in a transmit data path consistent with the present invention.

A Memory and Computationally Optimized Approach to Data Interleaving/De-interleaving in Forward Error Correction Having described the interleaving of seven data symbols in the 7×4(N×D) memory array with regard to the seven frames illustrated in FIGS. 5A–5C, reference is now directed to FIG. 6, which illustrates an improved forward error corrector that may be used with a DMT transmitter consistent with the present invention. In this regard, an improved FEC 100 may comprise a Reed-Solomon encoder 64 and an improved interleaver 110. In accordance with the present invention, the improved interleaver 110 may comprise a memory device 120 and a state machine 130. As illustrated in FIG. 6, the memory device may comprise a portion designated for interleave data, herein labeled interleave memory 122 and a second portion designated for fast path data, labeled fast path memory 124. The memory device 120 may be implemented via on chip random access memory (RAM) as well as with external RAM devices well known by those skilled in the art. As also illustrated in the functional block diagram of FIG. 6, the state machine 130 may comprise a controller 132, a memory address pointer 133, a memory index array 135, and a memory segment array 137.

In this regard, controller 132 coordinates the generation and operation of the memory index array 135, the memory segment array 137, and the memory address pointer 133 to ensure that data being written to interleave memory 122 by the Reed-Solomon encoder 64 is placed in a memory location where it can later be retrieved in the correct sequence for further digital processing. The controller 132 may also be configured to coordinate operation of one or more fast path memory pointers (not shown) to ensure that fast path data being stored in the fast path memory 124 by the Reed-Solomon encoder 64 is placed in memory locations where they can later be retrieved in the proper sequence for further digital processing. It is readily apparent that if fast path and interleave data are integrated or written to a single memory device using a forward operative process that the fast path and interleave data may be reassembled or read in the correct order by a similar process configured to automatically recognize fast path and interleaved data locations within the memory device.

As illustrated in the functional block diagram of FIG. 6, both fast path data and interleave data may be introduced at the input to a single Reed-Solomon encoder 64 for encoding. As each data word is encoded, the encoded output data may be sent to the memory device 120. In accordance with the present invention, if the data interleaving scheme selected calls for a N×D interleaving, where N is greater than D, the controller 132 may be configured to initialize only D pointers with one D pointer associated with each of N memory segments. Furthermore, the controller 132 may be configured to determine the size of each of the N memory segments in the interleave read direction in accordance with the relative memory position of a first code word of length N bytes written to the interleave memory 122. A length in bytes may be stored in the memory segment array 137 corresponding to each of the respective N memory segments. This W relationship will be explained again with regard to the exemplary schematics of FIGS. 8A–8F, which illustrate the interleaving of 11 code words with an interleaver depth of 8. In accordance with the method of the present invention, the controller 132 may be configured to identify the start position of a memory segment within the interleave memory 122 by way of the memory index 135. The controller 132 after having identified the memory segment may then write and or read data as required to or from an appropriate memory location further identified by way of the memory address pointer 133 associated with the present memory segment.

By processing both the fast path data and interleave data, the improved interleaver 110 of the present invention provides input processing rate adaptability as data may be stored by the interleave memory 122 once it has been encoded by Reed-Solomon encoder 64. Since, both the fast path and interleaved data are available in the same memory device 120, the improved interleaver 110 is rate adaptable to the next stage of digital signal processing, indicated in FIG. 6 as tone ordering. The tone ordering operation may control the rate that data is read from the interleave memory 122.

It will be appreciated by those skilled in art that the improved interleaver 110 may be implemented on a digital signal processor (DSP) integrated circuit, on an application specific integrated circuit (ASIC), or via discrete devices. All such variations are within the scope of the present invention. Furthermore, it will be appreciated that the memory address pointer 133, the memory index array 135, and the memory segment array 137 comprise one dimensional arrays that may be stored within the memory 120 or on another suitable memory device in communication with the controller 132. It will be also appreciated that there is no operational restriction that requires the memory address pointer 133, the memory index array 135, or the memory segment array 137 to be stored on the same memory device.

Figure 7:
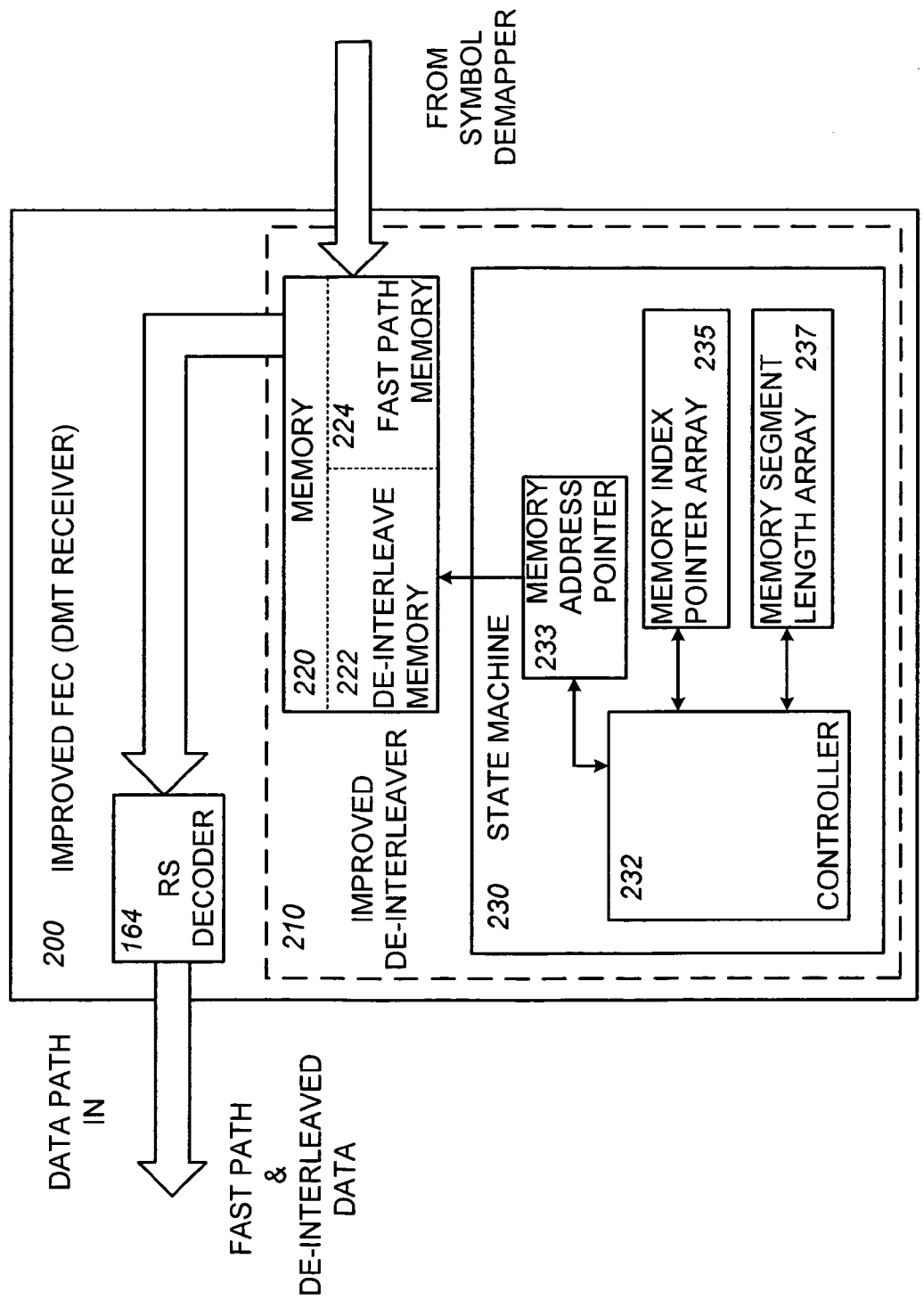
FIG. 7 is a functional block diagram illustrating an optimized state machine within a de-interleaver in a receive data path consistent with the present invention.

Having briefly described the operation of the memory address pointer 133, the memory index array 135, and the memory segment array 137 within the architecture of the improved FEC 100 in the transmit direction, reference is now directed to FIG. 7, which illustrates a functional block diagram featuring DMT transceiver architecture for the receive data path. In this regard, the improved FEC 200 may comprise a single Reed-Solomon decoder 164 and an improved de-interleaver 210. The improved de-interleaver 210 may further comprise a memory 220 and a state machine 230. As illustrated in FIG. 7, the memory device 220 may comprise a portion designated for de-interleave data, herein labeled de-interleave memory 222 and a second portion designated for fast path data, labeled fast path memory 224. The memory device 220 may be implemented via on chip random access memory (RAM) as well as with external RAM devices well known by those skilled in the art. As also illustrated in the functional block diagram of FIG. 7, the state machine 230 may comprise a controller 232, a memory address pointer 233, a memory index array 235, and a memory segment array 237.

In this regard, controller 232 generates and coordinates operation of the memory address pointer 233, the memory index array 235, and the memory segment array 237 to ensure that data being read from the de-interleave memory 222 by the Reed-Solomon decoder 164 is selected from a memory location that places the data in the correct sequence for further digital processing. The controller 232 may also be configured to coordinate operation of one or more fast path memory pointers (not shown) to ensure that fast path data being retrieved from the fast path memory 224 by the Reed-Solomon decoder 164 is retrieved in the proper sequence for further digital processing. It is readily apparent that if fast path and interleave data are integrated or written to a single memory device using a forward operative process that the fast path and interleave data may be reassembled or read in the correct order by an inverse process configured to retrieve both the fast path and interleaved data from the symbol demapper.

As illustrated in the functional block diagram of FIG. 7, both fast path data and interleave data may be introduced at the memory device 220 for temporary storage prior to decoding in the Reed-Solomon decoder 164. In accordance with the present invention, if the data interleaving scheme used to transmit the data called for a N×D interleaving, where N is greater than D, the controller 232 may be configured to initialize only N pointers with one N pointer associated with each of D memory segments. Furthermore, the controller 232 may be configured to determine the size of each of the D memory segments in the de-interleave read direction in accordance with the relative memory position of a first code word written to the de-interleave memory 222. This relationship will be explained again with regard to the exemplary flowchart of FIG. 10, which illustrates the initialization of a memory segment length array (i.e., the memory segment array 137) as may be used to interleave data as illustrated in the schematic diagrams presented in FIGS. 8A–8F. In accordance with a data de-interleaving method, the controller 232 may be configured to identify the start position of a memory segment within the de-interleave memory 222 by way of the memory index 235. The controller 232 after having identified the memory segment may then write and or read data as required to or from an appropriate memory location further identified by way of the memory address pointer 233 associated with the present memory segment.

By processing both the fast path data and interleave data, the improved de-interleaver 210 of the present invention provides input processing rate adaptability as data may be retrieved by the Reed-Solomon decoder 164 once it has been received and stored in by the de-interleave memory 222. The Reed-Solomon decoding operation may control the rate that data is read from the de-interleave memory 222.

As with the improved interleaver 110 of FIG. 6, it will be appreciated by those skilled in art that the improved de-interleaver 210 may be implemented on a digital signal processor (DSP) integrated circuit, on an application specific integrated circuit (ASIC), or via discrete devices. All such variations are within the scope of the present invention. Furthermore, it will be appreciated that the memory address pointer 233, the memory index array 235, and the memory segment array 237 comprise one-dimensional arrays that may be stored within the memory 220 or on another suitable memory device in communication with the controller 232. It will be also appreciated that there is no operational restriction that requires the memory address pointer 233, the memory index array 235, and the memory segment array 237 to be stored on the same memory device.

Figure 8A:
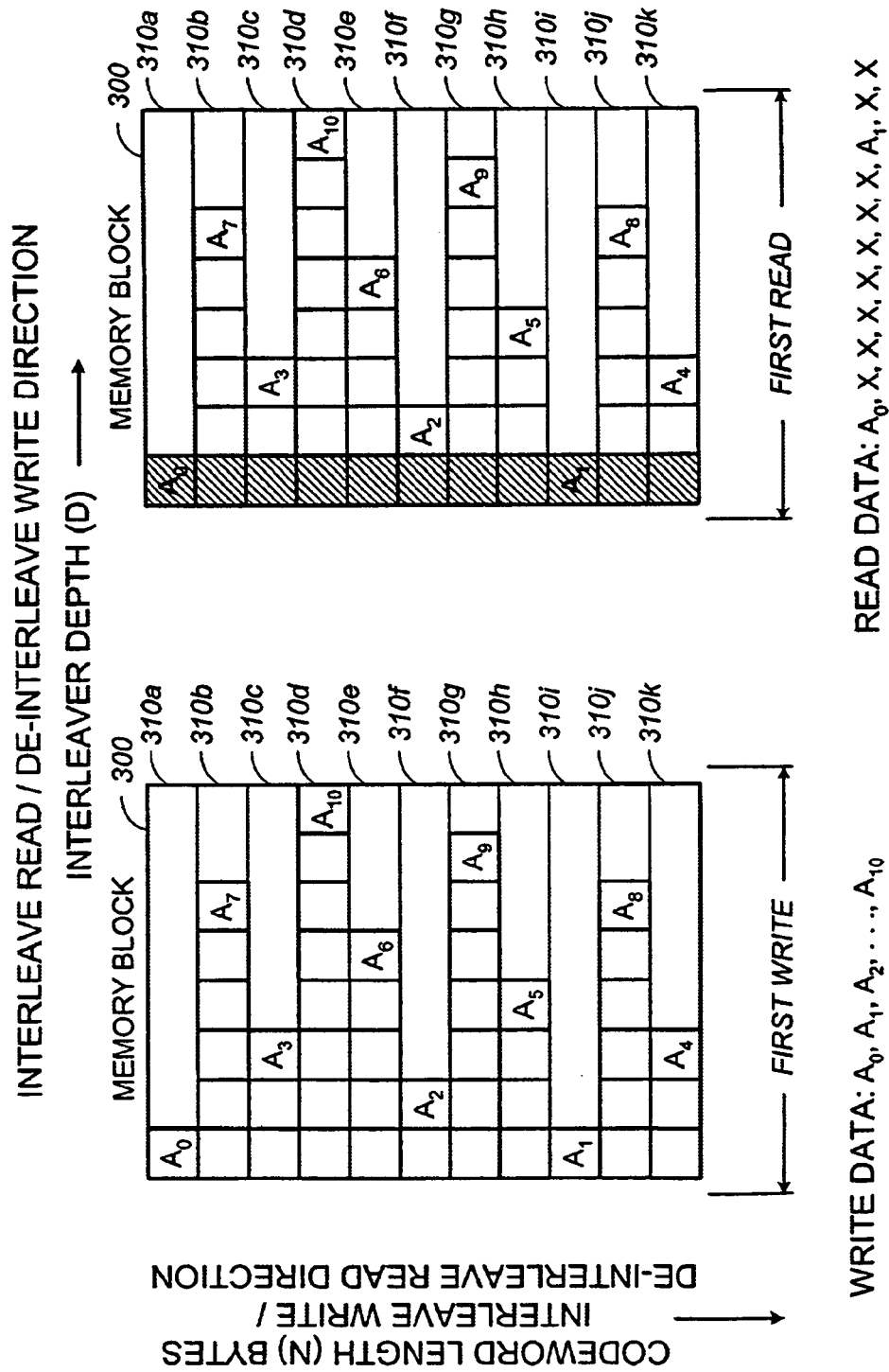
FIGS. 8A–8F form a set of schematic diagrams illustrating the operation of a data interleaver in a transmit path by showing the initialization and placement of interleaved data bytes for a particular block length, N, and interleaver depth, D, consistent with the present invention.

Having briefly described the location and operation of the memory address pointer 233, the memory index array 235, and the memory segment array 237 within the architecture of the improved FEC 200 in the receive direction, reference is now directed to FIGS. 8A–8F, which illustrates a data interleaving operation for a N×D interleaving scheme where N=11, and D=8. As illustrated in FIG. 8A a memory block 300 may comprise N memory segments 310 (i.e., the N rows 310a through 310k) and D columns. As also illustrated in FIG. 8A, a plurality of data bytes associated with a data code word may be interleaved (i.e., written to the memory block 300) in an interleave write direction identified by proceeding down the memory block 300 from the top of the page and an interleave read direction identified by proceeding from left to right. Once each column in the memory block 300 has been traversed, the subsequent code word byte may be written in the $D^{th}$ memory location as determined by the total memory locations remaining in the previous column and the number of memory locations in the present column.

FIG. 8A illustrates the initialization of the memory segments as defined by the first write operation of a code word of N bytes. In accordance with the method of the present invention, the first write operation associated with the first code word of length N initializes the improved interleaver 110 (FIG. 6) by associating each byte of the code word with a memory segment 310a through 310k. The depth of an associated code word byte further defines each of the N memory segments. In this regard, a data code word consisting of bytes $A_0$ through $A_{10}$ are written to a memory block 300 in the following manner. First, a start reference (i.e., a memory address) is defined within the interleave memory 122 (FIG. 6) for the interleave data. Having identified a reference for the first byte, $A_0$, a method for interleaving consistent with the present invention will write $A_0$ at this start memory location. Thereafter, subsequent bytes of the code word will be written to the $D^{th}$ memory location after the previous byte. Once N memory locations have been traversed, subsequent code word bytes are written in the adjacent interleave depth column as if the interleave memory 122 comprises a two-dimensional array. However, in accordance with the present invention, once each byte of the first code word is written to a memory location, a D index limit is associated with each of the N memory segments. For example, the first and ninth memory segments 310a, 310i respectively, are limited to one memory location (i.e., one code word byte), whereas the second memory segment 310b is limited to 6 memory locations. An alternative method for initializing the length of the N memory segments with an interleaver depth, D, will be presented and described in association with the flowchart of FIG. 10.

As illustrated in the first read portion of FIG. 8A (i.e., the memory block 300 on the right side of the figure), each of the first memory locations of each of the N memory segments (i.e., the left most column or the first interleave read position) is selected for the first memory read operation. As a result, the read data for this first read operation will comprise $A_0$, X, X, X, X, X, X, X, $A_j$, X, and X.

Figure 8B:
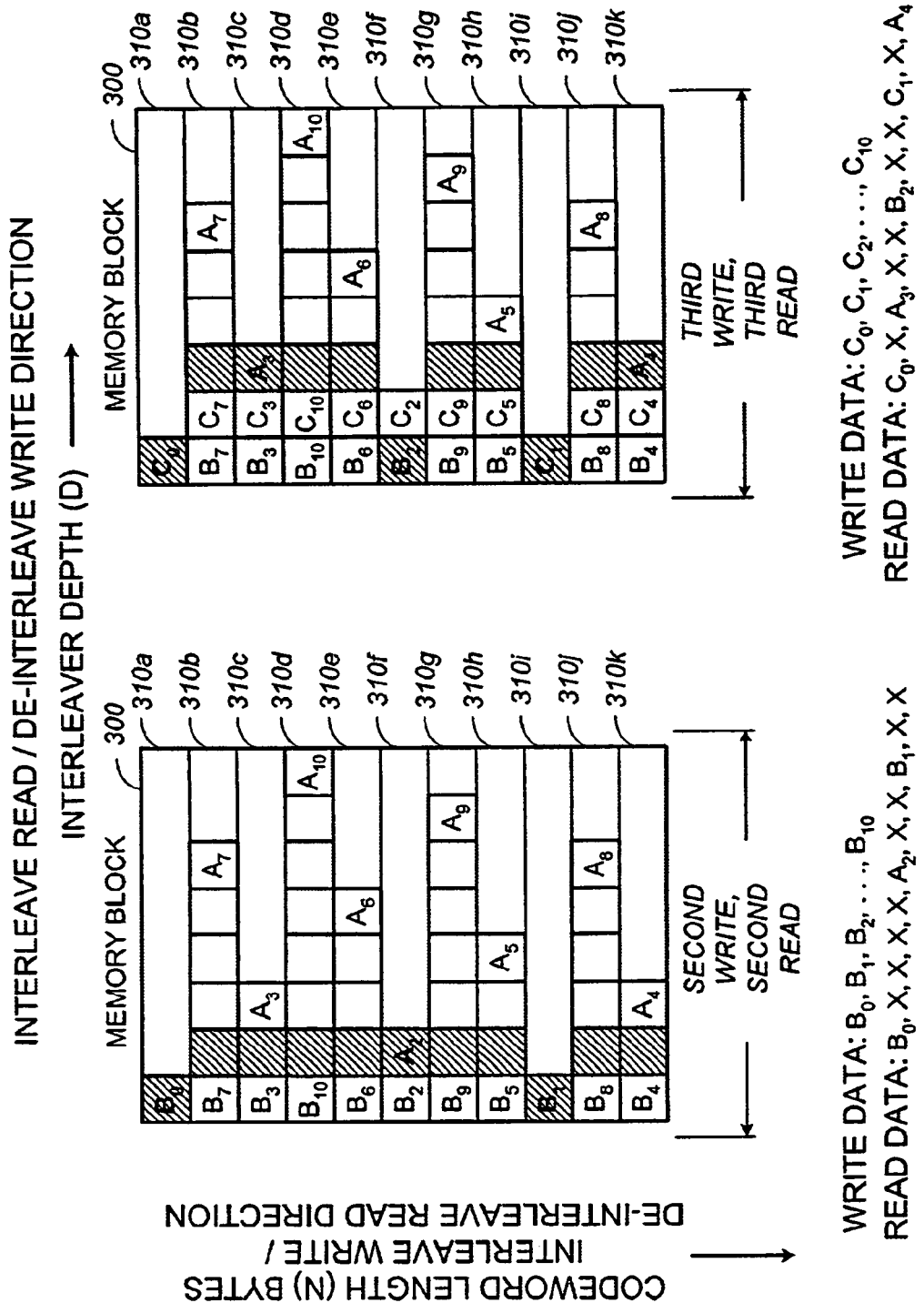

Having briefly described the initialization of the memory block 300 associated with a first interleave write operation and the expected results associated with a first interleave read operation as illustrated in FIG. 8A, reference is now directed to FIG. 8B, which illustrates a composite view of both the second write and second read operations as well as the third write and third read operations. In this regard, the left half of FIG. 8B presents the memory block 300 after a second interleave write and a second interleave read operation. More specifically, bytes $B_0$ through $B_{10}$ have been written to their associated memory segments 310. It is significant to note that each byte of the second code word (i.e., bytes $B_0$ through $B_{10}$) appears in a memory segment identified by the initialization step. For example, byte $B_9$ appears in the $7^{th}$ row from the top where the corresponding byte, $A_9$, from the first or initialization word was written. The left half of FIG. 8B also illustrates the state of the memory block 300 after a second read operation In accordance with the present invention, the second read operation looks to those memory locations that are identified with cross-hatching. As a result, the read data for the second read operation will comprise $B_0$, X, X, X, X, $A_2$, X, X, $B_1$, X, and X.

The right half of FIG. 5B presents the memory block 300 after a third interleave write and a third interleave read operation. More specifically, bytes $C_0$ through $C_{10}$ have been written to their associated memory segments 310. As with the previous two code words, each byte of the third code word (i.e., bytes $C_0$ through $C_{10}$) appears in a memory segment identified by the initialization step. For example, byte $C_8$ appears in the $10^{th}$ row from the top where the corresponding byte, $A_8$, from the first or initialization word was written. The right half of FIG. 5B also illustrates the state of the memory block 300 after a third read operation. In accordance with the present invention, the third read operation looks to those memory locations that are identified with cross-hatching. As a result, the read data for the third read operation will comprise $C_0$, X, $A_3$, X, X, $B_2$, X, X, $C_1$, X, and $A_4$.

Figure 8C:
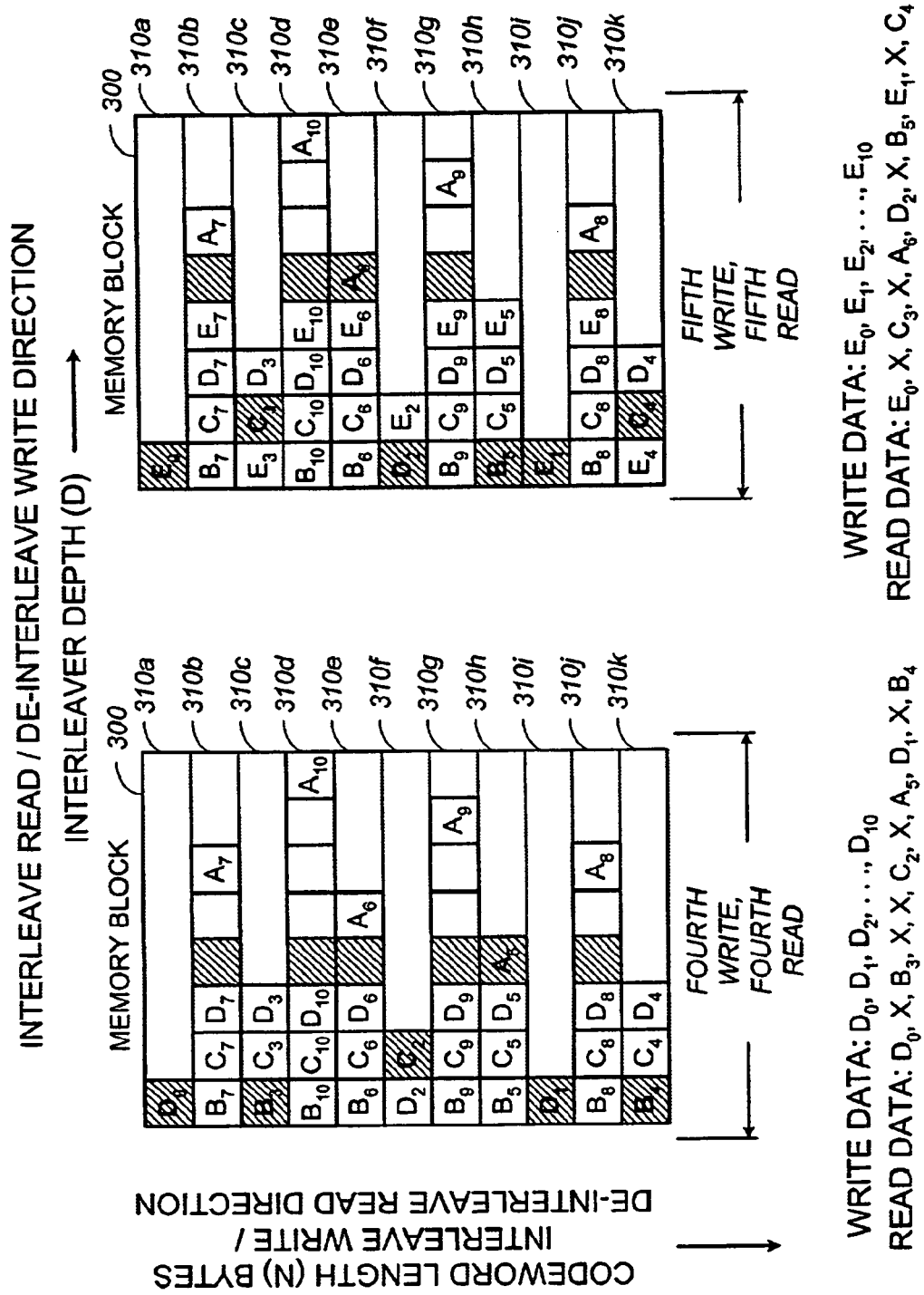

Reference is now directed to FIG. 8C, which illustrates a composite view of both the fourth write and fourth read operations as well as the fifth write and the fifth read operations. In this regard, the left half of FIG. 8B presents the memory block 300 after a fourth interleave write and a fourth interleave read operation. More specifically, bytes $D_0$ through $D_{10}$ have been written to their associated memory segments 310. For example, byte $D_7$ appears in memory segment 310b (i.e., the $2^{nd}$ row from the top) where the corresponding byte, $A_7$, from the first or initialization word was written. The left half of FIG. 8C, also illustrates the state of the memory block 300 after a fourth read operation. In accordance with the present invention, the fourth read operation looks to those memory locations that are identified with cross-hatching. As a result, the read data for the fourth read operation will comprise $D_0$, X, $B_3$, X, X, $C_2$, X, $A_5$, $D_1$, X, and $B_4$.

The right half of FIG. 8C presents the memory block 300 after a fifth interleave write and a fifth interleave read operation. More specifically, bytes $E_0$ through $E_{10}$ have been written to their associated memory segments 310. As with the previous four code words, each byte of the fifth code word (i.e., bytes $E_0$ through $E_{10}$) appears in a memory segment identified by the initialization step. For example, byte $E_4$ appears in memory segment 310k (i.e., the $11^{th}$ row from the top) where the corresponding byte, $A_4$, from the first or initialization word was written. The right half of FIG. 8C illustrates the state of the memory block 300 after a fifth read operation. In accordance with the present invention, the fifth read operation looks to those memory locations that are identified with cross-hatching. As a result, the read data for the fifth read operation will comprise $E_0$, X, $C_3$, X, $A_6$, $D_2$, X, $B_5$, $E_1$, X, and $C_4$.

Figure 8D:
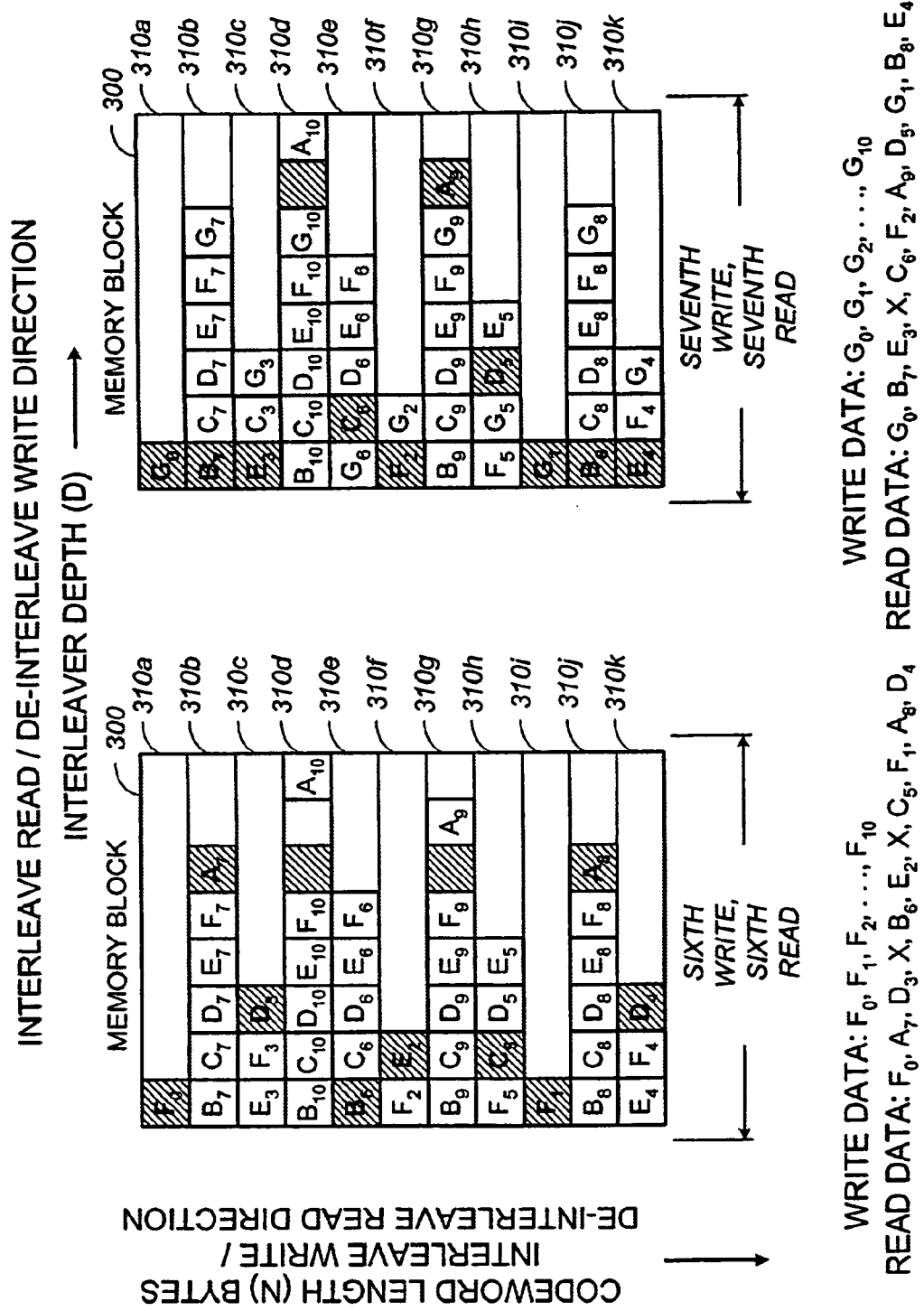

Having described the expected results associated with a fourth interleave write/read and a fifth interleave write/read operation as illustrated in FIG. 8C, reference is now directed to FIG. 5D, which illustrates a composite view of both the sixth write and sixth read operations, as well as, the seventh write and seventh read operations. In this regard, the left half of FIG. 8D presents the memory block 300 after a sixth interleave write and a sixth interleave read operation. More specifically, bytes $F_0$ through $F_{10}$ have been written to their associated memory segments 310. For example, byte $F_3$ appears in memory segment 310c (i.e., the $3^{rd}$ row from the top) where the corresponding byte, $A_3$, from the first or initialization word was written. The left half of FIG. 8D, also illustrates the state of the memory block 300 after a sixth read operation In accordance with the present invention, the sixth read operation looks to those memory locations that are identified with cross-hatching. As a result, the read data for the sixth read operation will comprise $F_0$, $A_7$, $D_3$, X, $B_6$, $E_2$, X, $C_5$, $F_1$, $A_8$, and $D_4$.

The right half of FIG. 8D presents the memory block 300 after a seventh interleave write and a seventh interleave read operation. More specifically, bytes $G_0$ through $G_{10}$ have been written to their associated memory segments 310. As with the previous six code words, each byte of the seventh code word (i.e., bytes $G_0$ through $G_{10}$) appears in a memory segment identified by the initialization step. For example, byte $G_2$ appears in memory segment 310f (i.e., the $6^{th}$ row from the top) where the corresponding byte, $A_2$, from the first or initialization word was written. The right half of FIG. 8D, also illustrates the state of the memory block 300 after a seventh read operation. In accordance with the present invention, the seventh read operation looks to those memory locations that are identified with cross-hatching. As a result, the read data for the seventh read operation will comprise $G_0$, $B_7$, $E_3$, X, $C_6$, $F_2$, $A_9$, $D_5$, $G_1$, $B_8$, and $E_4$.

Figure 8E:
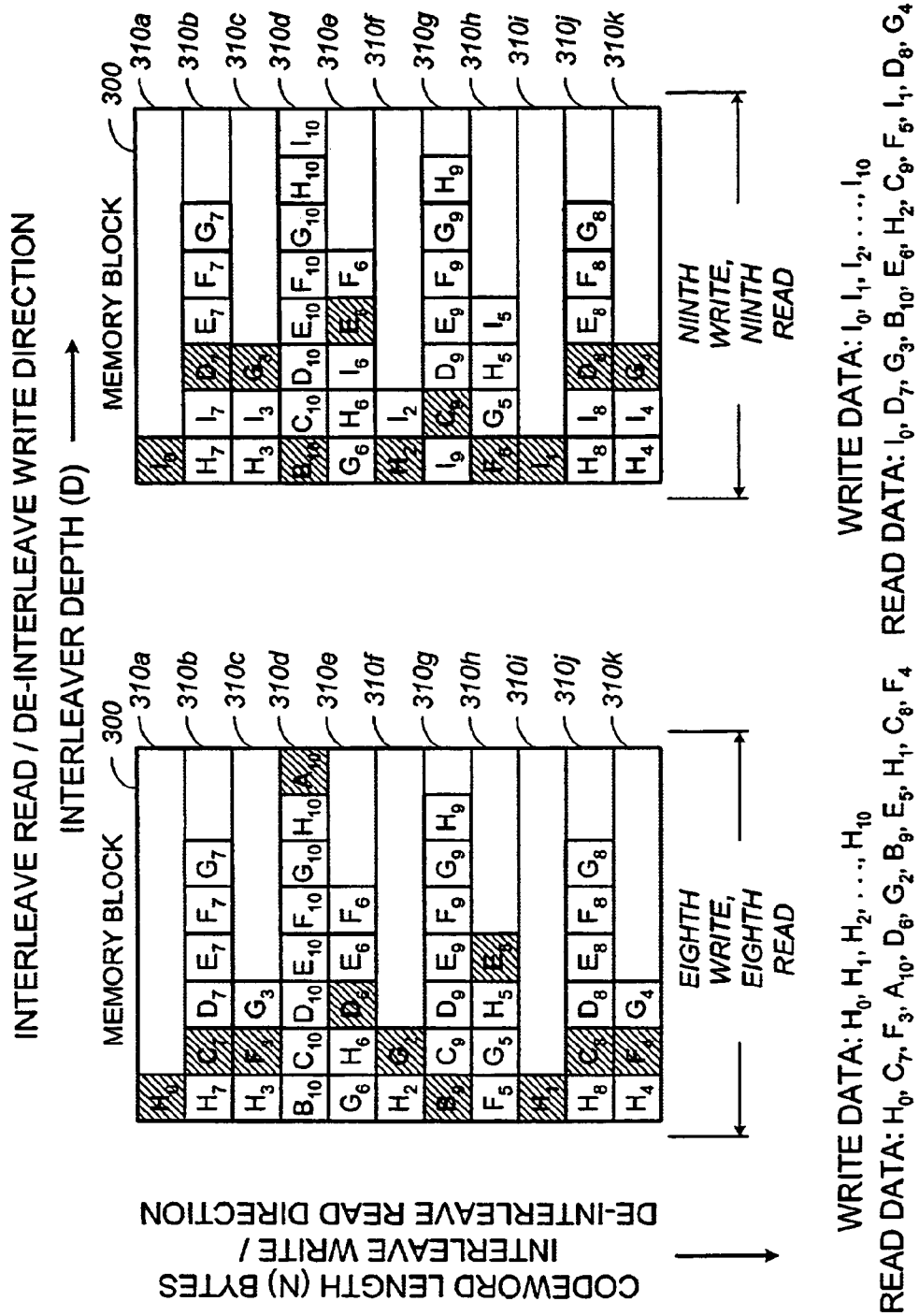

Reference is now directed to FIG. 8E, which illustrates a composite view of both the eighth write and eighth read operations, as well as, the ninth write and ninth read operations. In this regard, the left half of FIG. 8E presents the memory block 300 after an eighth interleave write and an eighth interleave read operation. More specifically, bytes $H_0$ through $H_{10}$ have been written to their associated memory segments 310. For example, byte $H_5$ appears in memory segment 310h (i.e., the $8^{th}$ row from the top) where the corresponding byte, $A_5$, from the first or initialization word was written. The left half of FIG. 8E, also illustrates the state of the memory block 300 after an eighth read operation. In accordance with the present invention, the eighth read operation looks to those memory locations that are identified with cross-hatching. As a result, the read data for the eighth read operation will comprise $H_0$, $C_7$, $F_3$, $A_{10}$, $D_6$, $G_2$, $B_9$, $E_5$, $H_1$, $C_8$, and $F_4$.

The right half of FIG. 8E presents the memory block 300 after a ninth interleave write and a ninth interleave read operation. More specifically, bytes $I_0$ through $I_{10}$ have been written to their associated memory segments 310. As with the previous eight code words, each byte of the ninth code word (i.e., bytes $I_0$ through $I_{10}$) appears in a memory segment identified by the initialization step. For example, byte $I_0$ appears in memory segment 310a (i.e., the first row from the top) where the corresponding byte, $A_0$, from the first or initialization word was written. The right half of FIG. 8E, also illustrates the state of the memory block 300 after a ninth read operation. In accordance with the present invention, the ninth read operation looks to those memory locations that are identified with cross-hatching. As a result, the read data for the ninth read operation will comprise $I_0$, $D_7$, $G_3$, $B_{10}$, $E_6$, $H_2$, $C_9$, $F_5$, $I_1$, $D_8$, and $G_4$.

Figure 8F:
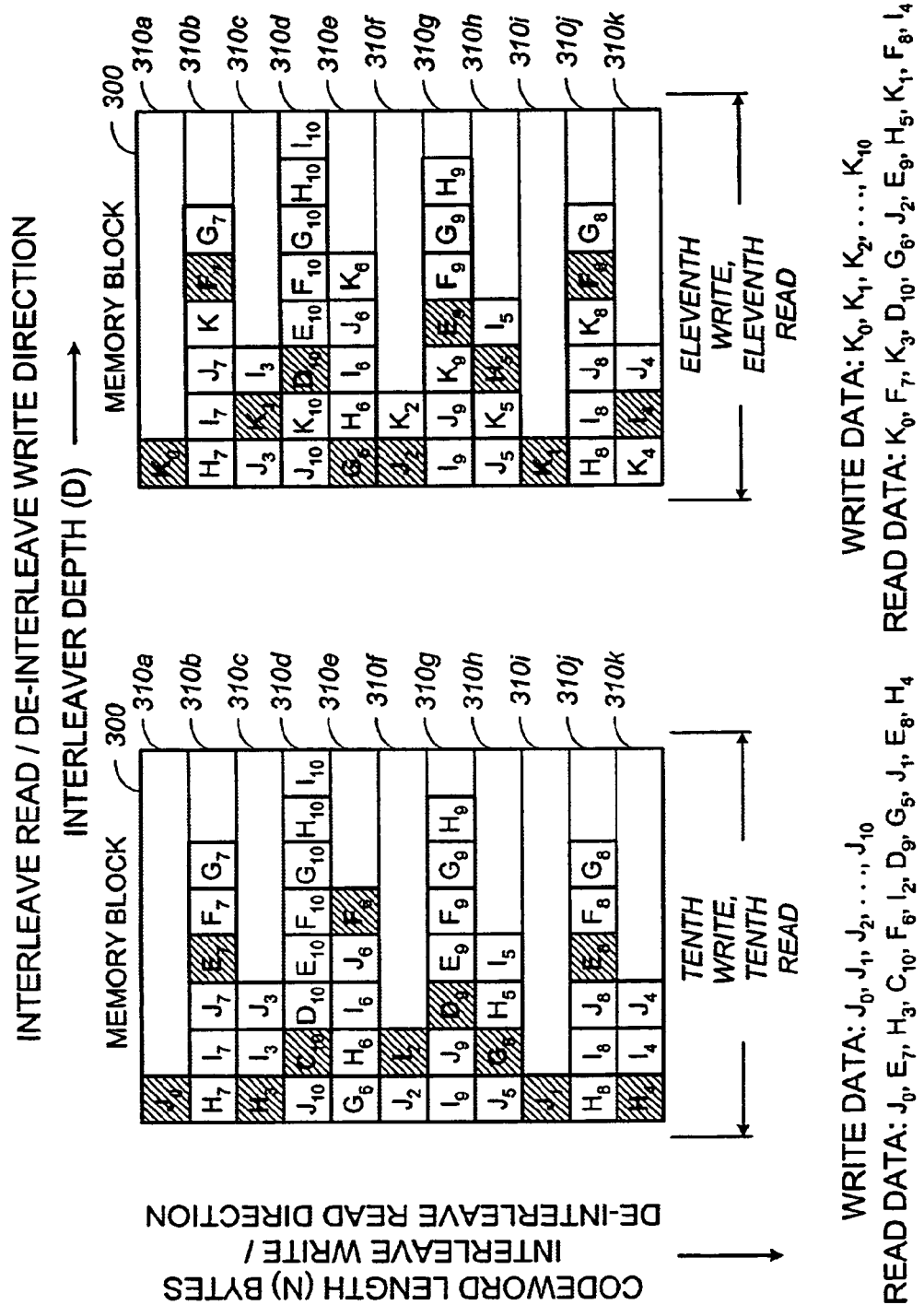

Having described the expected results associated with an eighth interleave write/read and a ninth interleave write/read operation as illustrated in FIG. 8E, reference is now directed to FIG. 8F, which illustrates a composite view of both the tenth write and tenth read operations, as well as, the eleventh write and eleventh read operations. In this regard, the left half of FIG. 8F presents the memory block 300 after a tenth interleave write and a tenth interleave read operation. More specifically, bytes $J_0$ through $J_{10}$ have been written to their associated memory segments 310. For example, byte $J_1$ appears in memory segment 310g (i.e., the $9^{th}$ row from the top) where the corresponding byte, $A_1$, from the first or initialization word was written. The left half of FIG. 8F, also illustrates the state of the memory block 300 after a tenth read operation. In accordance with the present invention, the tenth read operation looks to those memory locations that are identified with cross-hatching. As a result, the read data for the tenth read operation will comprise $J_0$, $E_7$, $H_3$, $C_{10}$, $F_6$, $I_2$, $D_9$, $G_5$, $J_1$, $E_8$, and $H_4$.

The right half of FIG. 8F presents the memory block 300 after an eleventh interleave write and an eleventh interleave read operation. More specifically, bytes $K_0$ through $K_{10}$ have been written to their associated memory segments 310. As with the previous ten code words, each byte of the eleventh code word (i.e., bytes $K_0$ through $K_{10}$) appears in a memory segment identified by the initialization step. For example, byte $K_6$ appears in memory segment 310e (i.e., the $5^{th}$ row from the top) where the corresponding byte, $A_6$, from the first or initialization word was written. The right half of FIG. 8F, also illustrates the state of the memory block 300 after an eleventh read operation. In accordance with the present invention, the eleventh read operation looks to those memory locations that are identified with cross-hatching. As a result, the read data for the eleventh read operation will comprise $K_0$, $F_7$, $K_3$, $D_{10}$, $G_6$, $J_2$, $E_9$, $H_5$, $K_1$, $F_8$, and $I_4$. After the completion of the eleventh interleave write/read operations, the entire contents of the N code words have been written to the improved interleave memory 122 (FIG. 6).

Subsequent code words may then be interleaved by repeating the N interleave write/read operations as described above.

Figure 9A:
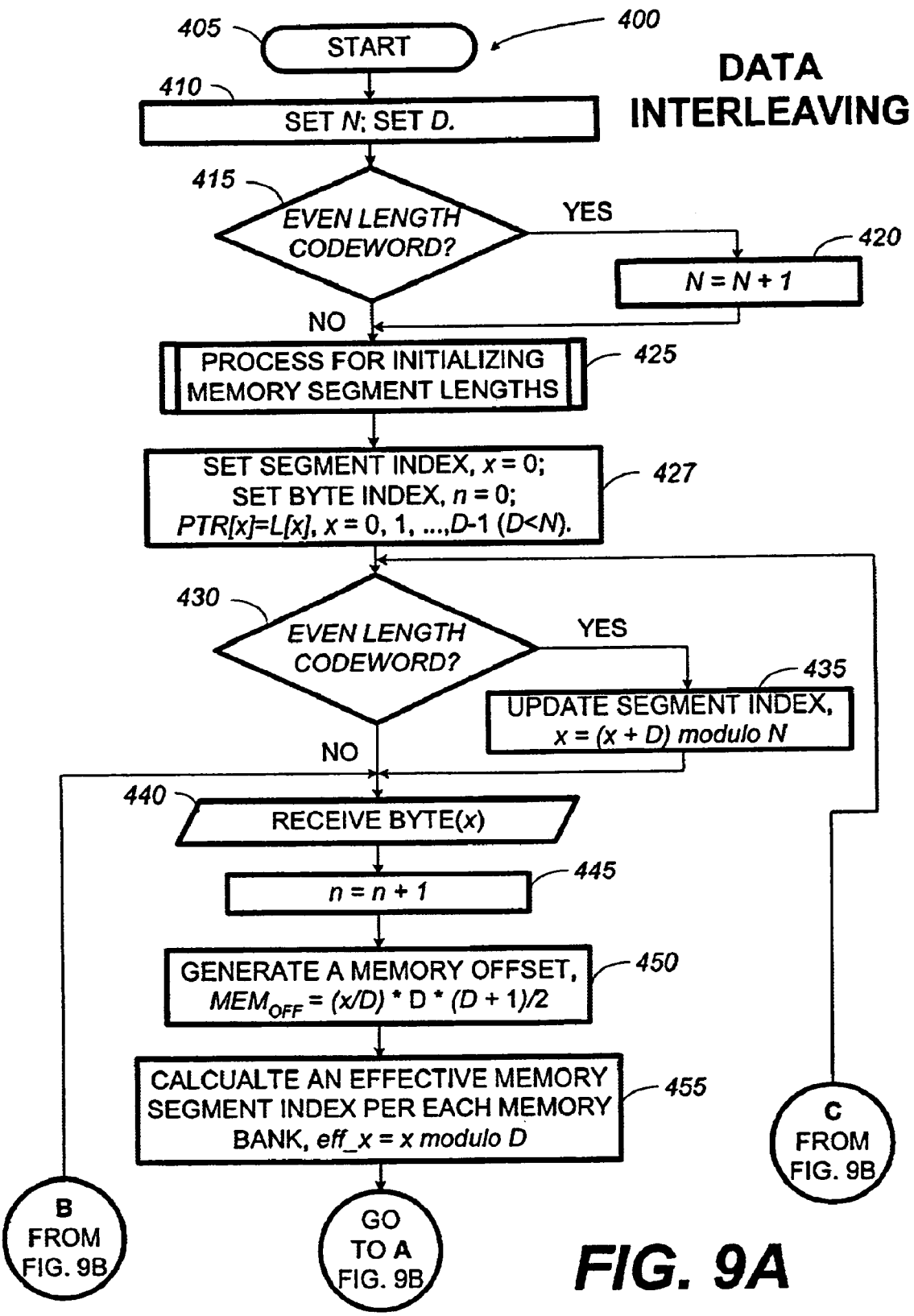

Having described the operation of the improved interleaver 110 of FIG. 6 with regards to the interleave write/read operations illustrated in FIGS. 8A through 8F, reference is now directed to FIGS. 9A and 9B, which further illustrate a method for data interleaving consistent with the present invention. In this regard, FIG. 9A illustrates a first portion of a flowchart depicting a method for data interleaving 400 that may be practiced by the improved interleaver of FIG. 6. More specifically, a method for data interleaving 400 may begin with step 405, designated "Start." Next, in step 410, the method for data interleaving initializes a block data length, N, an interleaver depth, D, a segment index, x, and a byte index, n, corresponding to the individual bytes of a code word. Having initialized the memory block size delimiters and the various indexes in step 410, the method for data interleaving 400 may proceed by performing the query of step 415. As illustrated in FIG. 9A, if it is determined that the code word length consists of an even number of bytes, the method for data interleaving 400 may continue with step 420 where the block data length may be incremented by one to force the block data length to an odd integer. Step 420 is sometimes referred to as inserting a dummy byte to enable convolutional data interleaving. Otherwise, if it is determined in step 415 that the code word length consists of an odd number of bytes, the method for data interleaving 400 may continue with step 425 where a process for initializing memory segment lengths may be performed.

Figure 10:
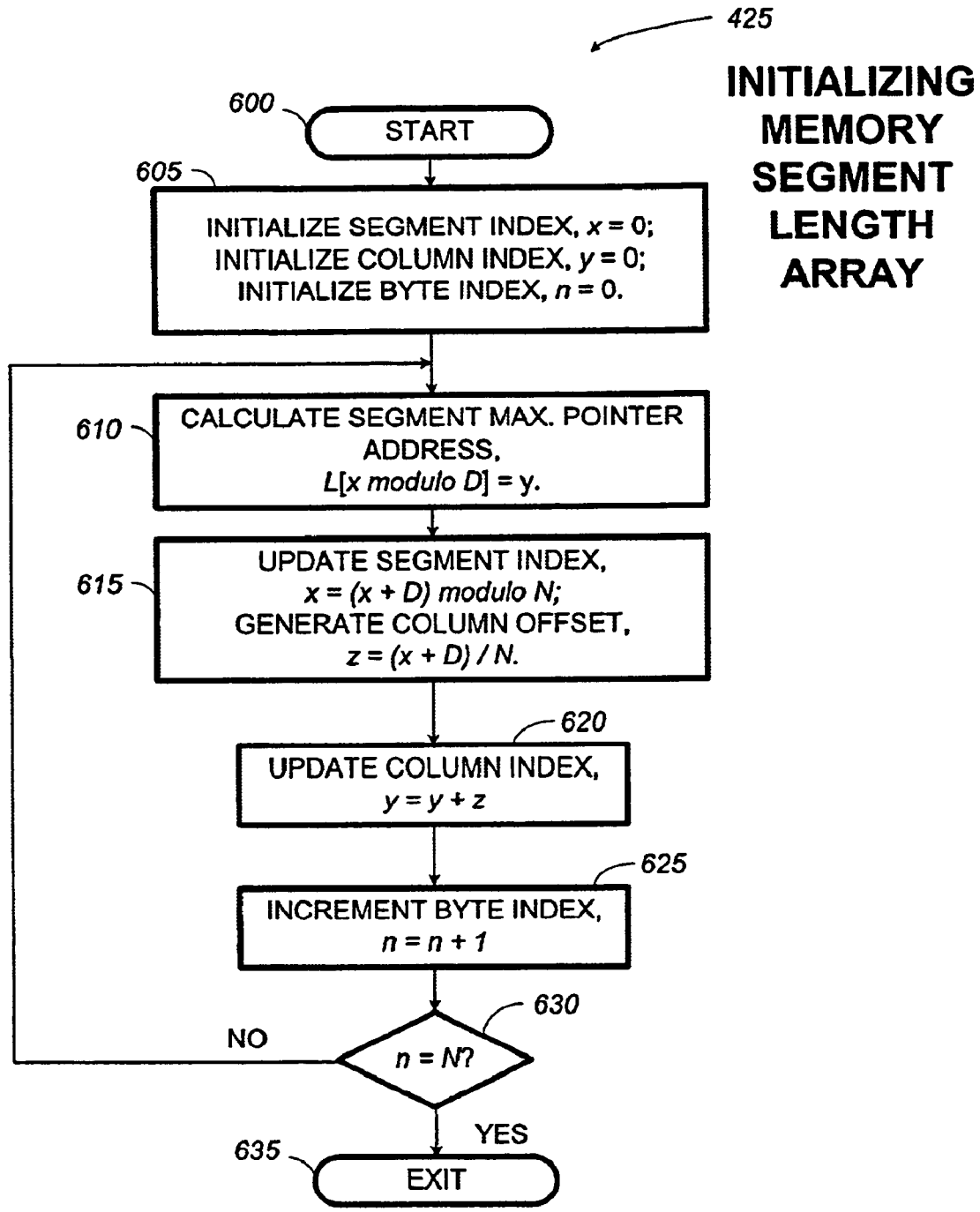
FIG. 10 presents a flowchart illustrating a method for initializing a memory segment length array.

As will be further described in association with the flowchart of FIG. 10, the method for initializing memory segment lengths 425 may be used to populate the memory segment array 137 (FIG. 1). As a result of performing step 425, a memory segment byte length will be associated with each of the N memory segments. For the example previously described with regards to FIGS. 8A through 8F, where N was greater than D (e.g., 11 is greater than 8), the memory segment lengths associated with each of the N memory segments are as follows: L[x]=[1,6,3,8,5,2,7,4,1,6,3]. It is significant to note that the memory segment byte length for the ninth, tenth, and eleventh memory segments (i.e., 1, 6, 3) repeat the sequence identified by the first three memory segments. In other words, the first D memory segments and their associated lengths define a memory bank. Each memory bank may comprise D*(D+1)/2 bytes. As a result, N/D memory banks may interleave data as previously described in association with the schematic diagrams of FIGS. 8A–8F.

After having determined the various values used in populating the memory segment array 137 (FIG. 1) in step 425, the method for data interleaving 400 may proceed with step 427 where the segment index and the byte index may be reset for receiving and writing data bytes to be interleaved and a pointer may be initialized as illustrated. In step 430 the method for data interleaving 400 may perform a query to determine if the code word consists of an even number of bytes. If the determination in step 430 is affirmative, the method for data interleaving 400 may update the segment index in accordance with a mathematical combination of the current segment index, the interleaving depth, and the block data length as illustrated in step 435. Otherwise, if the determination in step 430 indicates that the code word consists of an odd number of bytes, step 435 may be bypassed as shown.

Next, in step 440, the method for data interleaving 400 may receive a data byte to be interleaved. As illustrated in step 445, the byte index may be incremented followed by the generation of a memory offset as illustrated in step 450. The memory offset may be applied later in combination with other interim results to identify the appropriate write address within the memory bank for the present data byte. As shown in step 450, the memory offset may comprise a first mathematical combination of the segment index and the data interleaving depth, D. Next, as illustrated in step 455, the method for data interleaving 400 may be configured to calculate an effective memory segment index that may be applied to each of the N/D memory banks. As shown in step 455, the effective memory segment index may comprise a second mathematical combination of the segment index and the data interleaving depth, D. The method for data interleaving 400 may continue on FIG. 9B as illustrated by the flowchart connector near the bottom center of FIG. 9A.

Reference is now directed to the remaining portion of the method for data interleaving 400 illustrated in FIG. 9B. In this regard, a memory segment start address may be derived for each of the N memory segments. As illustrated in step 460, the memory segment start address may comprise a mathematical combination of the memory segment length, L[x], and the effective memory segment index calculated in step 455. Next, in step 465, the method for data interleaving 400 may calculate a memory write address for the present byte. As illustrated in step 470, the present data byte may be written to the memory block. The method for data interleaving 400 may then update the segment index as illustrated in step 475 and perform a query in step 480 to determine if subsequent bytes exist for the current data word being interleaved. If the determination in step 480 indicates that indeed more data bytes are to be processed for the present data word (i.e., the "NO" result from the query), the method for data interleaving may continue processing with step 440 where the next data byte may be received. Thereafter, steps 440 through 480 may be repeated until all bytes of the present code word have been written to memory.

After having written the present code word, the method for data interleaving 400 may continue by resetting the byte index, n, and updating a pointer array as illustrated in step 485. The step of updating the pointer array may comprise a mathematical combination of the previous pointer value and the present segment length, L[x], for each of the respective N memory segments. Next, the method for data interleaving 400 may perform a query to determine if the code word consists of an even number of bytes. If the result of the query in step 490 is affirmative, the method for data interleaving may continue with step 495 where the byte index may be incremented. Otherwise, if the query of step 490 determines that the code word consists of an odd number of bytes, the method for data interleaving may proceed to read the present identified byte using the address pointer as shown in step 500. Next, in step 505 the segment index may be incremented and the effective memory segment index may be updated as shown. The method for data interleaving may then perform a query in step 510 to determine if the entire code word has been read. If the result of the query in step 510 is negative, the method for data interleaving may increment the byte index as illustrated in step 515 and repeat steps 500 through 510 until the entire code word has been read. As illustrated in the flowchart of FIG. 9B, once the entire code word has been read the method for data interleaving may proceed to repeat steps 427 through 510 as required to continue interleaving data bytes.

Having described a method for data interleaving 400 with regard to the flowchart illustrated in FIGS. 9A and 9B, reference is now directed to FIG. 10, which illustrates a method for initializing the memory segment length array referenced in step 425 (FIG. 9A). In this regard the method for initializing a memory segment length array 425 may begin with step 600, herein labeled "Start." Next, a plurality of system variables may be initialized as illustrated in step 605. More specifically, the method for initializing a memory segment length array 425 may set a segment index, x, a column index, y, and a byte index, n, to 0. Having initialized the segment index, the column index, and the byte index, the method for initializing a memory segment length array 425 may perform step 610 to calculate a segment maximum pointer address. Next in step 615, the method for initializing a memory segment length array 425 may update the segment index, x, and generate a column offset, z, in accordance with a first and a second mathematical combinations of the segment index, the interleaver depth, and the block data length in bytes, respectively. The method for initializing a memory segment length array 425 may continue by updating the column index as shown in step 620. Next, the byte index may be incremented as illustrated in step 625. The method for initializing a memory segment length array 425 may continue by performing the query of step 625 to determine if a memory segment length has been determined for each of the N memory segments. If the determination in step 630 is negative, i.e., all memory segments lengths have not been processed, the method for initializing a memory segment length array 425 may return to repeat steps 610 through 630 as required until the one dimensional memory segment length array is populated. Once the determination in step 630 indicates that the memory segment length array has been populated, the method for initializing a memory segment length array 425 may perform step 635, herein labeled, "Stop." It will be appreciated that step 635 may serve as a trigger to return to the method for data interleaving previously described with regard to the flowcharts of FIGS. 9A and 9B.

Any process descriptions or blocks in the flowcharts of FIGS. 9A–B and FIG. 10 should be understood to represent modules, segments, or portions of code which include one or more executable instructions for implementing specific logical functions or steps in the method for data interleaving 400. Alternate implementations are included within the scope of the preferred embodiment of the present invention in which functions may be executed out of order from that shown or discussed, including substantially, concurrently, or in reverse order, depending on the functionality involved, as would be understood by those reasonably skilled in the art of the present invention.

It will be appreciated that the method for data interleaving 400 in accordance with the present invention may comprise an ordered listing of executable instructions for implementing logical functions and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 11A:
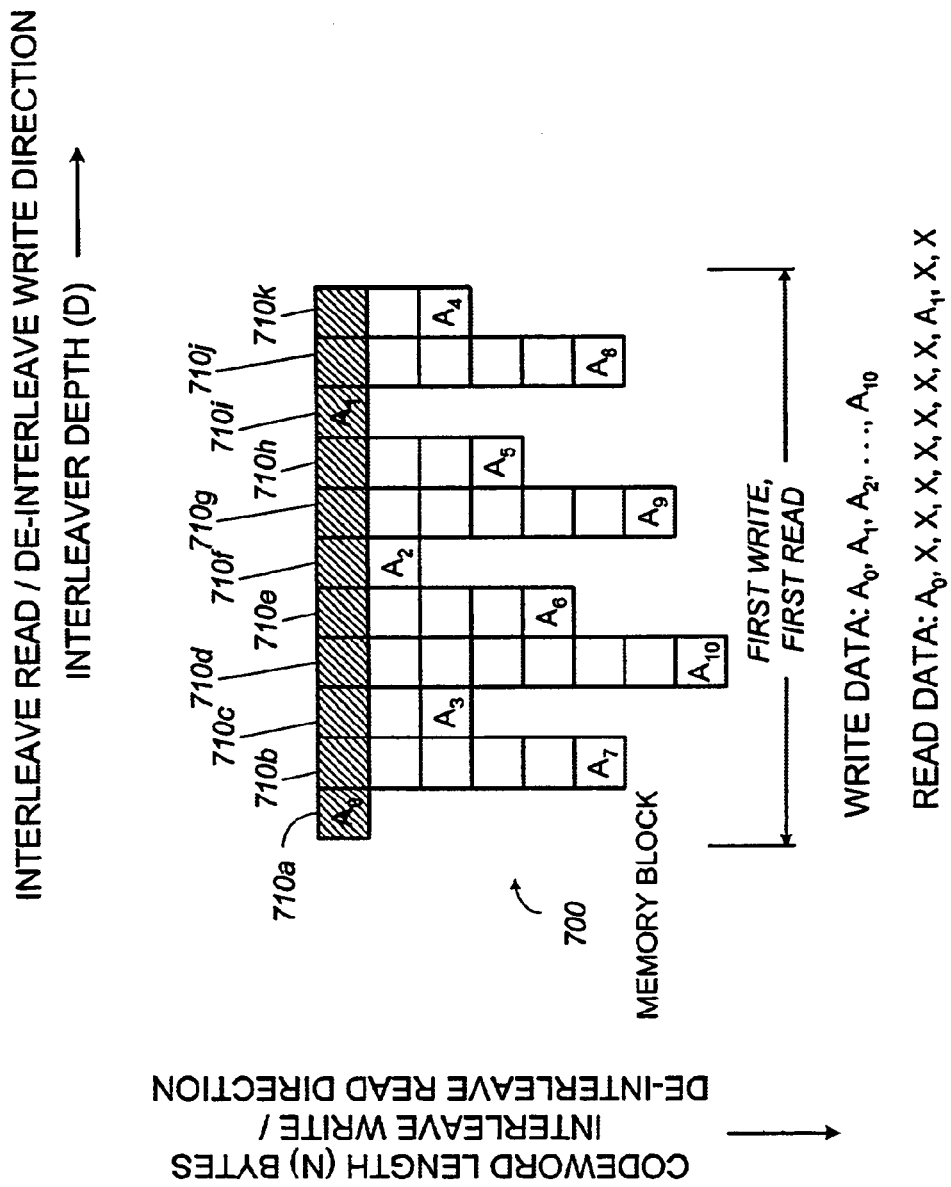
FIGS. 11A and 11B present schematic diagrams illustrating the operation of a data de-interleaver in a receive path configured to de-interleave the data interleaved in FIGS. 8A–8F.

Having described the method for data interleaving 400 with regard to the flowchart of FIGS. 9A and 9B, along with the method for initializing the memory segment length array with regard to FIG. 10, reference is now directed to FIG. 11A, which illustrates a first de-interleave write operation followed by a first de-interleave read operation that may be performed by the improved de-interleaver 210 of FIG. 210. In this regard, FIG. 11A illustrates the initialization of a de-interleave memory block 700 suited to the de-interleaving of the data previously interleaved in the N×D interleaving scheme introduced in FIGS. 8A–8F. As illustrated in FIG. 11A, a memory block 700 may comprise N memory segments 710 (i.e., the N columns 710a through 710k) and D rows. As also illustrated in FIG. 11A, a plurality of data bytes associated with a data code word may be de-interleaved (i.e., written to the memory block 700) in a de-interleave write direction identified by proceeding from left to right across the figure. As also illustrated in FIG. 11A, a de-interleave read direction associated with the memory block 700 may be identified by traversing down the memory block 700 from the top of the figure. Once each row in the memory block 700 has been traversed, a subsequent code word byte may be written in the $D^{th}$ memory location as determined by the total memory locations remaining in the previous row and the number of memory locations in the present row.

FIG. 11A illustrates the initialization of the memory segments as defined by the first write operation of a code word of N bytes. In accordance with the present invention, the first write operation associated with the first code word of length N initializes the improved de-interleaver 210 (FIG. 7) by associating each byte of the code word with a memory segment 710a through 710k. The depth of an associated code word byte further defines each of the N memory segments. In this regard, a data code word consisting of bytes $A_0$ through $A_{10}$ is written to the memory block 700 in the following manner. First, a start reference (ie., a memory address) is defined within the de-interleave memory 222 (FIG. 7) for the de-interleave data. Having identified a reference for the first byte, $A_0$, a method for de-interleaving consistent with the present invention will write $A_0$ at this start memory location. Thereafter, subsequent bytes of the code word will be written to the $D^{th}$ memory location after the previous byte proceeding across the N memory segments 710. Once N memory locations have been traversed, subsequent code word bytes are written in the adjacent de-interleave row as if the de-interleave memory 222 comprises a two-dimensional array. However, in accordance with the present invention, once each byte of the first code word is written to a memory location, a D index limit is associated with each of the N memory segments 710. For example, memory segments 710a and 710i are limited to one memory location (i.e., one byte), whereas memory segment 710b is limited to 6 memory locations.

As illustrated in FIG. 11A, each of the first memory locations of each of the N memory segments 710 (ie., the upper most row or the first de-interleave read position) is selected for the first de-interleaver memory read operation. As a result, the read data for this first read operation will comprise $A_0$, X, X, X, X, X, $A_1$, X, and X.

Figure 11B:
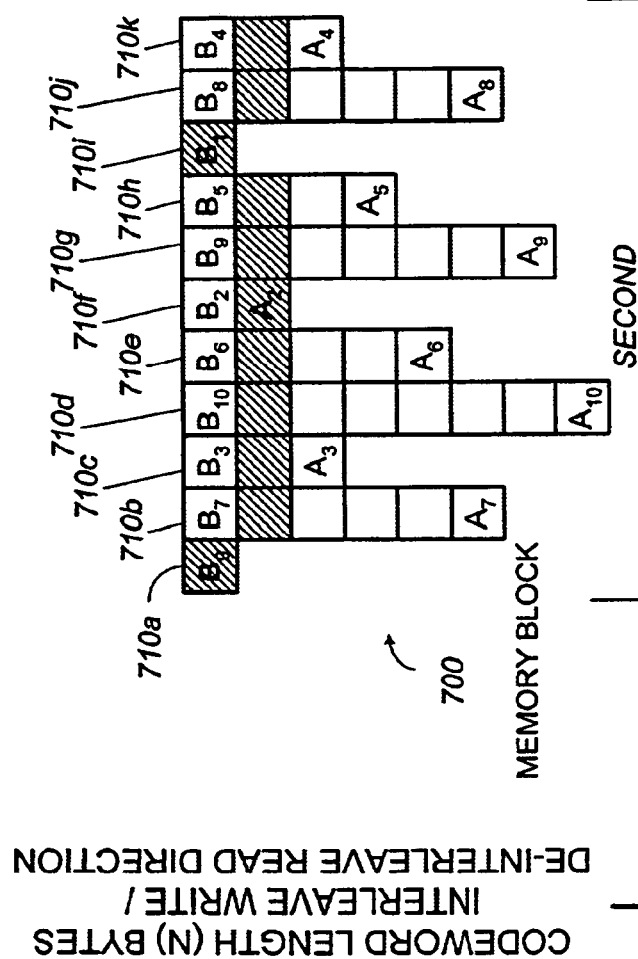

Having briefly described the initialization of the memory block 700 associated with a first de-interleave write operation and the expected results associated with a first de-interleave read operation as illustrated in FIG. 11A, reference is now directed to FIG. 11B, which illustrates both a second write and a second read operation. In this regard, FIG. 11B presents the memory block 700 after a second de-interleave write and a second de-interleave read operation. More specifically, bytes $B_0$ through $B_{10}$ have been written to their associated memory segments 710. It is significant to note that each byte of the second code word (i.e., bytes $B_0$ through $B_{10}$) appears in a memory segment identified by the initialization step. For example, byte $B_9$ appears in memory segment 710g (i.e., the $7^{th}$ column from the left) where the corresponding byte, $A_9$, from the first or initialization word was written. FIG. 10B also illustrates the state of the memory block 700 after a second read operation. In accordance with the present invention, the second read operation looks to those memory locations that are identified with cross-hatching. As a result, the read data for the second read operation will comprise $B_0$, X, X, X, X, $A_2$, X, X, $B_1$, X, and X.

Those skilled in the art will appreciate that code words may be received and de-interleaved (i.e., placed in their original sequence order prior to interleaving) by completing the process illustrated in FIGS. 11A and 11B for each of the remaining code words. As with the data interleaving process illustrated in FIGS. 5A–8F and FIGS. 9A–9B, the data de-interleaving process relies on a set of pointers and a depth or memory size limit associated with each of the N memory segments to control the data de-interleaving process.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Therefore, having thus described the invention, at least the following is claimed:

1. A method for convolutional data interleaving/de-interleaving comprising:
   identifying a block data length, N, and an interleaver/de-interleaver depth, D;
   segmenting a memory device in response to the block data length by dividing a memory into N memory segments;
   initializing a set of pointer maximum values responsive to the relative magnitude of N and D;
   initializing a set of pointers wherein a pointer value is associated with each of N memory segments;
   identifying a start memory address relative to a base address and the set of pointer maximum values associated with each of the N memory segments;
   initializing a memory segment identifier and a byte identifier;
   receiving a $n^{th}$ byte of a code word;
   generating a memory offset responsive to a mathematical combination of the segment identifier and the data interleaving depth;
   calculating an effective memory segment index;
   generating a memory segment start address responsive to the set of pointer maximum values and the effective memory segment index;
   generating a memory block write address responsive to the memory offset, the memory segment start address and the effective pointer value associated with the $n^{th}$ memory segment;
   writing the all $n^{th}$ byte of a code word;
   updating the set of pointers; and
   systematically reading each byte of the code word from memory device.

2. The method of claim 1, wherein the set of pointers comprise D pointers for the case where N>D.

3. The method of claim 1, wherein the set of pointers comprise N pointers for the case where D>N.

4. The method of claim 1, wherein the step of updating the pointer associated with the $N^{th}$ memory segment comprises incrementing a present pointer magnitude by a fixed delta then performing a modulo operation on the pointer maximum value associated with the $N^{th}$ memory segment.

5. The method of claim 4, wherein the fixed delta is an integer.

6. The method of claim 5, wherein the integer is 1.

7. The method of claim 1, further comprising the step of incrementing the present memory segment identifier by D modulo N.

8. The method of claim 1, wherein the step of generating a memory offset comprises dividing the memory segment identifier by the interleaver depth, multiplying the result by the interleaver depth, and further multiplying by one-half of the combination of the interleaver depth and an integer offset.

9. The method of claim 1, wherein the effective memory segment index comprises the memory segment identifier modulo the interleaver depth.

10. The method of claim 1, wherein the memory segment start address comprises the sum of the set of pointer maximum values associated with previously received bytes and an integer offset.

11. The method of claim 1, wherein the memory block write address comprises the sum of the memory offset, the memory segment start address, and the effective pointer value associated with the $n^{th}$ memory segment.

12. The method of claim 1, wherein the updated set of pointers comprises the sum of the present pointer and an integer offset modulo the set of pointer maximum values associated with each of the N memory segments.

13. The method of claim 1, wherein the step of systematically reading each byte comprises resetting the byte index and the segment index, then reading each byte in sequence order in accordance with an effective segment index comprising the sum of the segment index and an integer offset modulo the interleaver depth.

14. A data interleaver/de-interleaver comprising:
   means for receiving a desired interleaving/de-interleaving depth, D and a data block length, N;
   means for receiving and storing individual bytes of a code word; and
   means for segmenting the means for storing by dividing the means for storing into N segments, wherein the means for storing requires less than N×D bytes to interleave/de-interleave N code words.

15. The interleaver/de-interleaver of claim 14, wherein the means for segmenting comprises means for identifying N distinct portions of a memory device.

16. The interleaver/de-interleaver of claim 14, further comprising:
means for generating and storing an array of pointer values.

17. The interleaver/de-interleaver of claim 16, wherein the means for generating is responsive to a segment index modulo the interleaver depth.

18. The interleaver/de-interleaver of claim 14, wherein the means for storing comprises an array of pointer maximum values associated with each of the N segments, respectively.

19. The interleaver/de-interleaver of claim 14, wherein the means for storing comprises a memory index array associated with each of the N segments, respectively.

20. The interleaver/de-interleaver of claim 19, wherein the memory index array comprises addresses generated from a mathematical combination of a base address and the array of pointer maximum values.

21. A data interleaver/de-interleaver for convolutional interleaving/de-interleaving of code words, comprising:
a memory device; and
a controller in communication with the memory device, the controller configured to receive an interleaving depth, D, an address increment signal, and an initialize signal, wherein the controller segments the memory device by dividing the a memory into multiple segments such that each byte of a code word is written to a particular address within a particular segment of the memory device in accordance with a memory address pointer derived from a memory offset, a memory segment start address, and a memory segment pointer.

22. The interleaver/de-interleaver of claim 21, wherein the controller segments the memory device into N memory segments, where N is the length in bytes of a code word.

23. The interleaver/de-interleaver of claim 21, wherein the controller segments the memory device into N memory segments having an associated maximum storage capacity in bytes less than or equal to the interleaver depth.

24. The interleaver/de-interleaver of claim 21, wherein the memory offset comprises a mathematical combination of a memory segment identifier and the interleaver depth.

25. The interleaver/de-interleaver of claim 21, wherein the memory segment start address comprises a mathematical combination of the maximum storage capacity associated with each previously processed data byte, an effective memory segment offset, and an integer offset.

26. The interleaver/de-interleaver of claim 21, wherein the memory segment pointer comprises a mathematical combination of the maximum storage capacity associated with a presently identified memory segment with an integer offset modulo the maximum storage capacity associated with the presently identified memory segment.

27. The interleaver/de-interleaver of claim 21, wherein the controller writes a code word before reading data.

28. The interleaver/de-interleaver of claim 21, wherein the memory segment pointers comprise D elements for the case where N is greater than D.

29. The interleaver/de-interleaver of claim 21, wherein the memory segment pointers comprise N elements for the case where D is greater than N.

30. The interleaver/de-interleaver of claim 21, wherein the starting address associated with each of the subsequent N−1 memory segments is determined by computing the sum of the starting address and the memory segment address maximum value associated with the N−$1^{th}$ memory segment.

31. A method for initializing memory segment lengths for use in an optimized convolutional data interleaving/de-interleaving process, comprising:
initializing a segment index, a column index, and a byte index;
receiving an interleaver/de-interleaver depth, D, and a block data length, N;
identifying a particular memory segment by performing a mathematical combination of the segment index and the interleaver/de-interleaver depth, D;
limiting the length in bytes of the identified memory segment to the column index;
updating the segment index;
generating a column offset;
updating the column index;
incrementing the byte index; and
repeating the identifying step through the incrementing step until a memory segment length is identified for each of N memory segments.

32. The method of claim 31, wherein identifying a particular memory segment comprises the segment index modulo the interleaver/de-interleaver depth.

33. The method of claim 31, wherein updating the segment index comprises a combination of the segment index and the interleaver/de-interleaver depth modulo the block data length.

34. The method of claim 31, wherein generating a column offset comprises an integer quotient of a combination of the segment index and the interleaver/de-interleaver depth divided by the block data length.

35. The method of claim 31, wherein updating the column index comprises the sum of the present column index and the column offset.

* * * * *